(12) United States Patent
Seko

(10) Patent No.: US 11,232,949 B2
(45) Date of Patent: Jan. 25, 2022

(54) DISPLAY DEVICE

(71) Applicant: TIANMA JAPAN, LTD., Kanagawa (JP)

(72) Inventor: Nobuya Seko, Kawasaki (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/454,933

(22) Filed: Jun. 27, 2019

(65) Prior Publication Data
US 2020/0006453 A1   Jan. 2, 2020

(30) Foreign Application Priority Data

Jun. 28, 2018 (JP) .............................. JP2018-123598
Jun. 28, 2018 (JP) .............................. JP2018-123600

(51) Int. Cl.
| | | |
|---|---|---|
| *H01L 21/02* | (2006.01) | |
| *H01L 27/32* | (2006.01) | |
| *H01L 51/56* | (2006.01) | |
| *H01L 29/786* | (2006.01) | |
| *H01L 27/12* | (2006.01) | |

(52) U.S. Cl.
CPC .. *H01L 21/02667* (2013.01); *H01L 21/02672* (2013.01); *H01L 21/02675* (2013.01); *H01L 27/1218* (2013.01); *H01L 27/1274* (2013.01); *H01L 27/3262* (2013.01); *H01L 29/78696* (2013.01); *H01L 51/56* (2013.01)

(58) Field of Classification Search
CPC ............. H01L 27/3262; H01L 27/1218; H01L 29/78696; H01L 51/56; H01L 27/1274; H01L 21/02667; H01L 21/02672; H01L 21/02675

See application file for complete search history.

(56) References Cited

U.S. PATENT DOCUMENTS

| | | | | |
|---|---|---|---|---|
| 5,981,974 A | * | 11/1999 | Makita | ................. H01L 21/2026 257/72 |
| 2003/0222589 A1 | * | 12/2003 | Osame | ................. H01L 27/3262 315/169.1 |
| 2004/0238831 A1 | * | 12/2004 | Osame | .............. H01L 29/78696 257/83 |
| 2015/0069348 A1 | * | 3/2015 | Tae | ...................... H01L 27/3262 257/40 |
| 2017/0132974 A1 | * | 5/2017 | Matsueda | ............ G09G 3/3275 |

* cited by examiner

*Primary Examiner* — Feifei Yeung Lopez
(74) *Attorney, Agent, or Firm* — Sughrue Mion, PLLC

(57) ABSTRACT

A display device includes a substrate; a plurality of light-emitting elements on the substrate; and a plurality of pixel circuits on the substrate, being configured to control the plurality of light-emitting elements in one-to-one correspondence. Each of the plurality of pixel circuits includes a thin film transistor. The thin film transistor includes a channel. The plurality of pixel circuits are disposed at different positions in a scanning direction of a pulse laser beam for annealing the channels. At least channels for light-emitting elements of the same color out of the channels are disposed at the same phase of irradiation cycles of the pulse laser beam in the scanning direction.

13 Claims, 26 Drawing Sheets

| n | $P_{UNIT}$ | | $P_{ELA}$ | N |
|---|---|---|---|---|
| 2 | 207 | $3^2 \times 23$ | 23 | 9 |
| 4 | 414 | $2 \times 3^2 \times 23$ | 18 | 23 |
| 14 | 1449 | $3^2 \times 7 \times 23$ | 21 | 69 |

$P_{PIX}=103.5(\mu m)$  $P_{ELA}=18(\mu m)$

| PIXEL No. | NUMBER OF ELA CYCLES | TFT-TO-TFT DISTANCE (µm) | RELATIVE POSITION (µm) | ACCUMULATED DISTANCE (µm) |
|---|---|---|---|---|
| A | 6 | 108 | 0 | 103.5 |
| B | 6 | 108 | 4.5 | 207 |
| C | 6 | 108 | 9 | 310.5 |
| D | 5 | 90 | 13.5 | 414 |
| SUM | 23 | 414 | | |

*FIG. 10*

$P_{PIX}$=103.5(μm)   $P_{ELA}$=23(μm)

| PIXEL No. | NUMBER OF ELA CYCLES | TFT-TO-TFT DISTANCE (μm) | RELATIVE POSITION (μm) | ACCUMULATED DISTANCE (μm) |
|---|---|---|---|---|
| A | 5 | 115 | 0 | 103.5 |
| B | 4 | 92 | 11.5 | 207 |
| SUM | 9 | 207 | | |

$P_{PIX}$=103.5(μm)   $P_{ELA}$=23(μm)

| PIXEL No. | NUMBER OF ELA CYCLES | TFT-TO-TFT DISTANCE (μm) | RELATIVE POSITION (μm) | ACCUMULATED DISTANCE (μm) |
|---|---|---|---|---|
| A | 5 | 105 | 0 | 103.5 |
| B | 5 | 105 | 1.5 | 207 |
| C | 5 | 105 | 3 | 310.5 |
| D | 5 | 105 | 4.5 | 414 |
| E | 5 | 105 | 6 | 517.5 |
| F | 5 | 105 | 7.5 | 621 |
| G | 5 | 105 | 9 | 724.5 |
| H | 5 | 105 | 10.5 | 828 |
| I | 5 | 105 | 12 | 931.5 |
| J | 5 | 105 | 13.5 | 1035 |
| K | 5 | 105 | 15 | 1138.5 |
| L | 5 | 105 | 16.5 | 1242 |
| M | 5 | 105 | 18 | 1345.5 |
| N | 4 | 84 | 19.5 | 1449 |
| SUM | 69 | 1449 | | |

FIG. 16

DISPLAY DEVICE

CROSS-REFERENCE TO RELATED APPLICATIONS

This Non-provisional application claims priority under 35 U.S.C. § 119(a) on Patent Application No. 2018-123598 filed in Japan on Jun. 28, 2018 and Patent Application No. 2018-123600 filed in Japan on Jun. 28, 2018, the entire contents of which are hereby incorporated by reference.

BACKGROUND

This disclosure relates to a display device. An organic light-emitting diode (OLED) element is a self-light-emitting element to be driven by electric current and therefore, it does not require backlight. In addition to this, the OLED display element has advantages to achieve low power consumption, wide viewing angle, and high contrast ratio; it is expected to contribute to development of flat panel display devices.

An active matrix type of OLED display device has a display region where a plurality of pixels are arrayed in columns and rows like a matrix. Each pixel includes one or more subpixels. In the case where each pixel includes a plurality of subpixels, the subpixels in a pixel emit different colors of light. A subpixel includes a pixel circuit including a transistor for selecting the subpixel and a driving transistor for supplying electric current to the OLED element that produces display of the subpixel. The transistors included in an OLED display device are thin film transistors (TFTs) and typically, they are low-temperature poly-silicon (LTPS) TFTs.

A single-color OLED display device has an array of pixels of a single color only; in contrast, a full-color OLED display device has an array of subpixels of three primary colors of red (R), green (G), and blue (B) or an array of white (W) subpixels with RGB color filter arrays to attain full-color display.

To produce poly-silicon including active layers of TFTs, a low-temperature poly-silicon process crystalizes (poly-crystalizes) an amorphous silicon (a-Si) film with an excimer laser annealing (ELA) system. An ELA system is a pulse laser system that irradiates a long narrow area per shot. The ELA system crystalizes the entire silicon film on a substrate with the long narrow irradiation area. Accordingly, the ELA system scans the substrate in one direction by moving the irradiation area of a pulse laser beam little by little in such a manner that the irradiation area of the next shot overlaps the irradiation area of the previous shot. For this reason, the poly-silicon film has cyclic characteristics variation in accordance with the scanning pitch determined by the pulse frequency and the scanning speed.

Since the subpixels are regularly disposed in rows and columns within the display region, the subpixel pitch is usually determined by the screen size and the resolution. The ELA scanning pitch is determined from the standpoint of the process to attain the fundamental characteristics of the TFTs. Accordingly, the positional relations of the TFTs (the channels thereof) to the irradiation areas of successive shots of a pulse laser beam are different among the subpixels physically disposed at different locations in the scanning direction. Hence, the TFTs may have different characteristics among pixel circuits.

For example, in the case where the display region is scanned vertically with a long narrow pulse laser beam for ELA under the condition where the long axis of the pulse laser beam is made coincide with the horizontal direction of the display region, a displayed image could have cyclic patterns of horizontal bright and dark stripes. These horizontal stripes are called display unevenness. The striped unevenness cyclically appearing in a displayed image is caused by the non-uniformity of the TFT characteristics. The display unevenness caused by the non-uniformity of the TFT characteristics could also be observed on a liquid crystal display device as disclosed in U.S. Pat. No. 5,981,974, for example.

SUMMARY

An aspect of this disclosure is a display device including: a substrate; a plurality of light-emitting elements on the substrate; and a plurality of pixel circuits on the substrate, being configured to control the plurality of light-emitting elements in one-to-one correspondence. Each of the plurality of pixel circuits includes a thin film transistor. The thin film transistor includes a channel. The plurality of pixel circuits are disposed at different positions in a scanning direction of a pulse laser beam for annealing the channels. At least channels for light-emitting elements of the same color out of the channels are disposed at the same phase of irradiation cycles of the pulse laser beam in the scanning direction.

Another aspect of this disclosure is a display device including: a substrate; a plurality of light-emitting elements on the substrate; and a plurality of pixel circuits on the substrate, being configured to control the plurality of light-emitting elements in one-to-one correspondence. Each of the plurality of pixel circuits includes a thin film transistor. The thin film transistor includes a channel. The channel is composed of sections extending in a first direction and sections extending in a second direction, an absolute value of an angle between the first direction and a scanning direction of a pulse laser beam for annealing the channel is a predetermined value, the second direction is perpendicular to the scanning direction, and the sections extending in the first direction and sections extending in the second direction are connected alternately. At least one end of each section extending in the second direction is connected with a side extending along the first direction of an end part in the first direction of a section extending in the first direction. In each section extending in the second direction, a middle line extending straight in the second direction from one end to the other end is defined as first virtual line. At each position in the first direction of the first virtual lines, a sum of a total length of the first virtual lines and a product of a number of sections extending in the first direction that exist in the second direction and a channel width takes the same value. At a position in the first direction where a second virtual line extending straight in the second direction does not cross any section extending in the second direction, a product of a number of sections extending in the first direction that is crossed by the second virtual line and the channel width takes a value equal to the same value. A dimension in the scanning direction of the channel is an integral multiple of a scanning pitch of the pulse laser beam.

It is to be understood that both the foregoing general description and the following detailed description are exemplary and explanatory and are not restrictive of this disclosure.

BRIEF DESCRIPTION OF THE DRAWINGS

FIG. 10 provides numerical values for specifying the layout provided in FIG. 9;

FIG. 16 provides numerical values for specifying the layout provided in FIG. 15;

EMBODIMENTS

Hereinafter, embodiments of this invention will be described with reference to the accompanying drawings. It should be noted that the embodiments are merely examples to implement this invention and are not to limit the technical scope of this invention.

Overview

In the organic light-emitting diode (OLED) display device to be disclosed hereinafter, the pixel circuit of a subpixel includes a thin film transistor (TFT) for selecting the subpixel and a driving TFT for supplying electric current to the subpixel. The TFTs in the pixel circuit are poly-silicon (poly-Si) TFTs having a poly-silicon channel.

The poly-silicon of the TFTs is so-called low-temperature poly-silicon (LTPS). The poly-silicon active layer of a TFT is formed by crystallizing (poly-crystalizing) an amorphous silicon (a-Si) film by scanning it with a pulse laser beam shaped like a long narrow line and further, processing it by photolithography and etching.

Figure 1A:
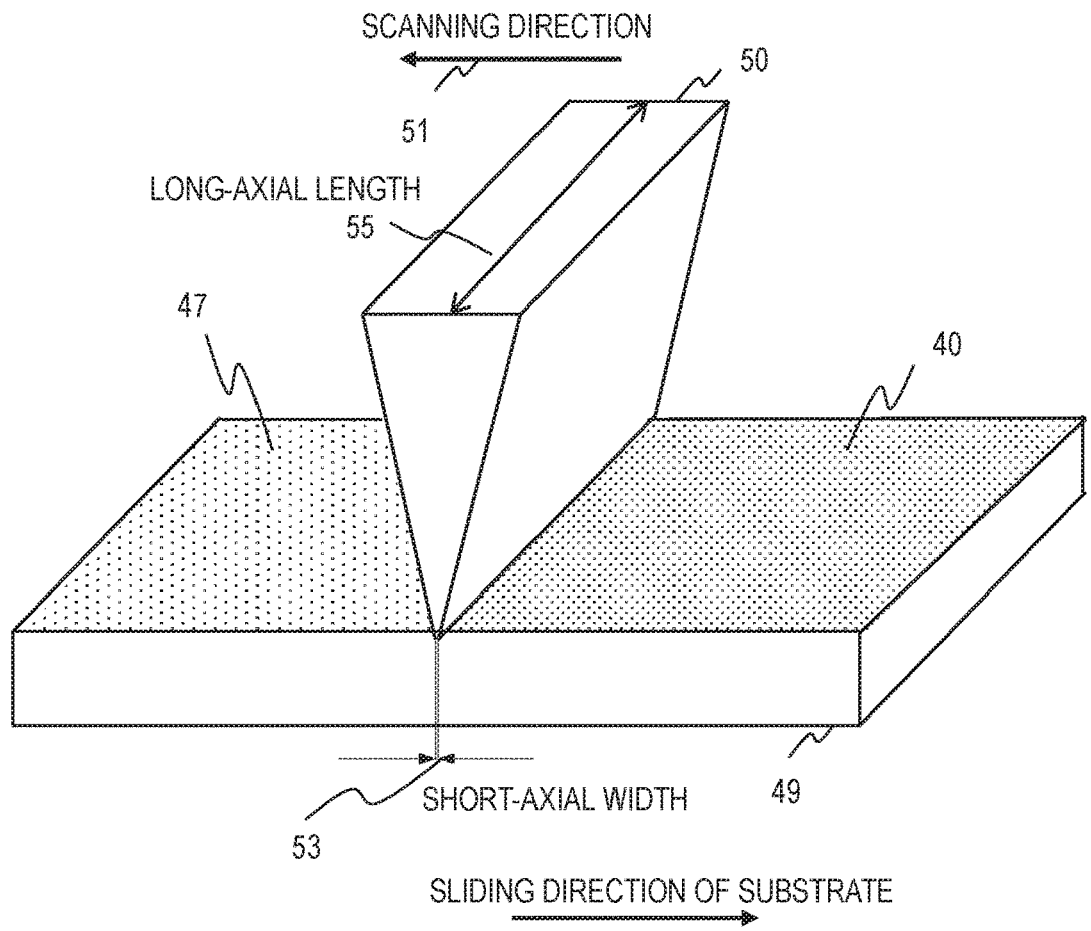
FIG. 1A schematically illustrates laser annealing with a pulse laser beam from an ELA system.

The pulse laser system for the crystallization is usually an excimer laser system, which is also called an excimer laser annealing (ELA) system. FIG. 1A schematically illustrates laser annealing with a pulse laser beam 50 from an ELA system. The pulse laser beam 50 is a long narrow line beam. When the length of the line is defined as long axis and the width of the line as short axis, the short-axis is parallel to the scanning direction and the long-axis is perpendicular to the scanning direction. The short-axial width 53 in FIG. 1A is the dimension along the short axis of an area irradiated with the pulse laser beam 50 and the long-axial length 55 is the dimension along the long axis of the area irradiated with the pulse laser beam 50.

The ELA system repeatedly irradiates an amorphous silicon film 47 with a pulse laser beam while moving the irradiation area little by little in such a manner that the irradiation area of the next shot overlaps the irradiation area of the previous shot. A typical ELA system changes the irradiation area by sliding a substrate 49. The amorphous silicon film 47 instantly melts in response to a pulse laser beam and subsequently solidifies into a crystal. The entire amorphous silicon film 47 can be crystallized by being scanned with a long narrow pulse laser beam 50. However, when seen microscopically, the trace of the pulse laser beam 50 remains at the end of the short-axial width of each irradiation area on the crystallized poly-silicon film 40. For this reason, the poly-silicon film 40 has cyclic characteristics variation in accordance with the scanning pitch (irradiation pitch) of the pulse laser beam.

Figure 1B:
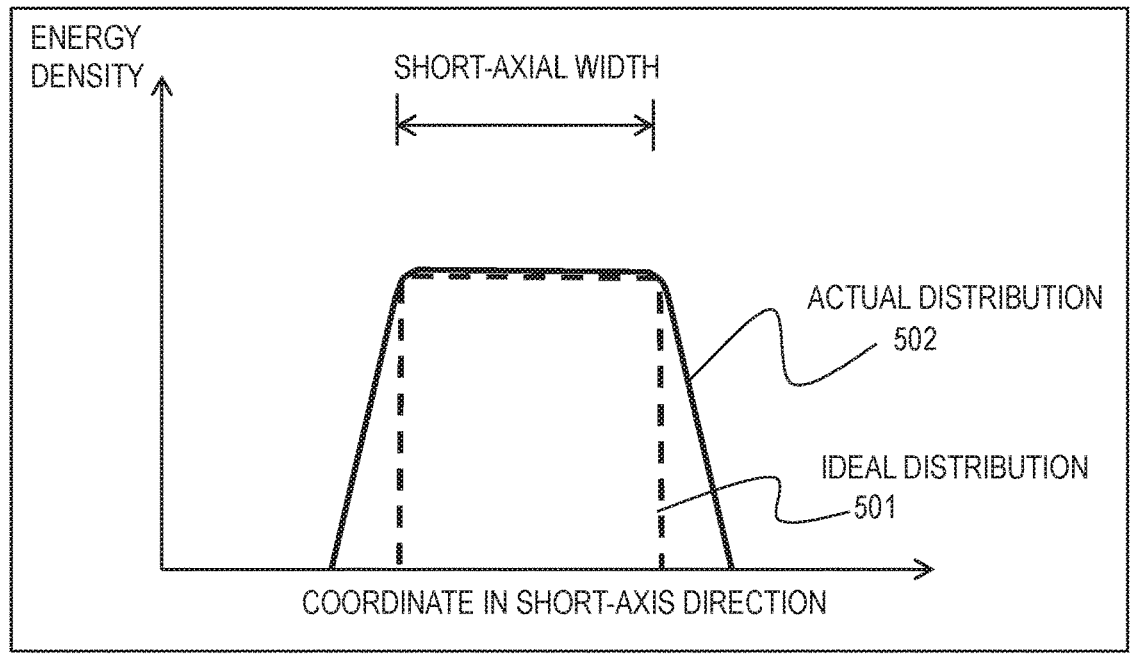
FIG. 1B is a graph representing the energy distribution of a pulse laser line beam in the short-axis direction.

The process of crystallization is described more with reference to FIGS. 1B to 1E. FIG. 1B is a graph representing the energy distribution of a pulse laser line beam in the short-axis direction. In FIG. 1B, the horizontal axis represents the coordinate in the short-axis direction and the vertical axis represents energy density. Although the ideal energy distribution in the short-axis direction of a pulse laser line beam is schematically expressed as a rectangle (the dashed line 501 in FIG. 1B), the actual energy distribution has finite inclines at the ends (the solid line 502 in FIG. 1B).

Figure 1C:
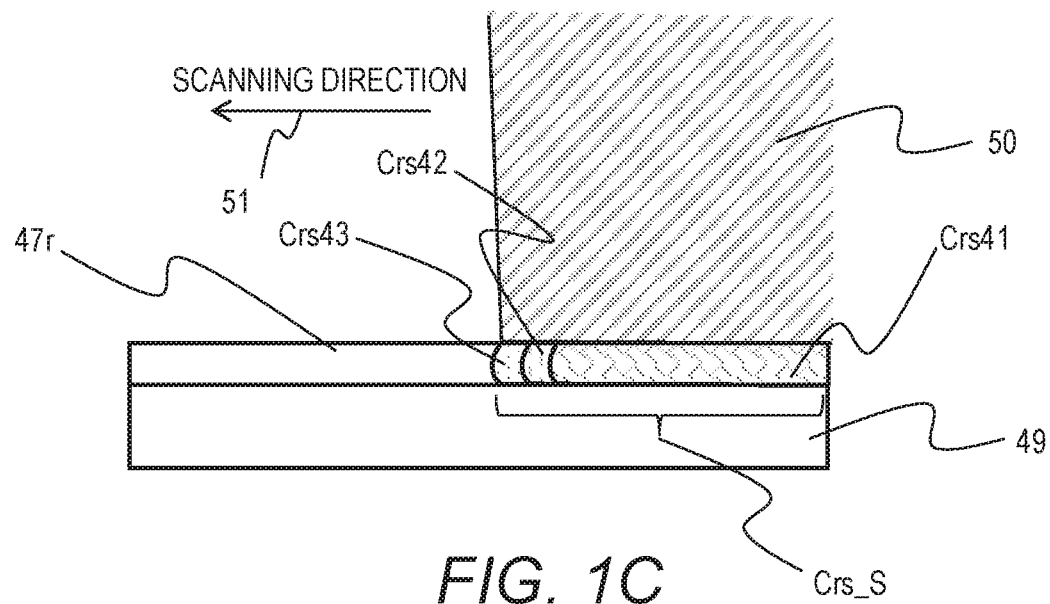
FIG. 1C is a first diagram for schematically illustrating the enlarged front end in the scanning direction of a pulse laser beam.
Figure 1D:
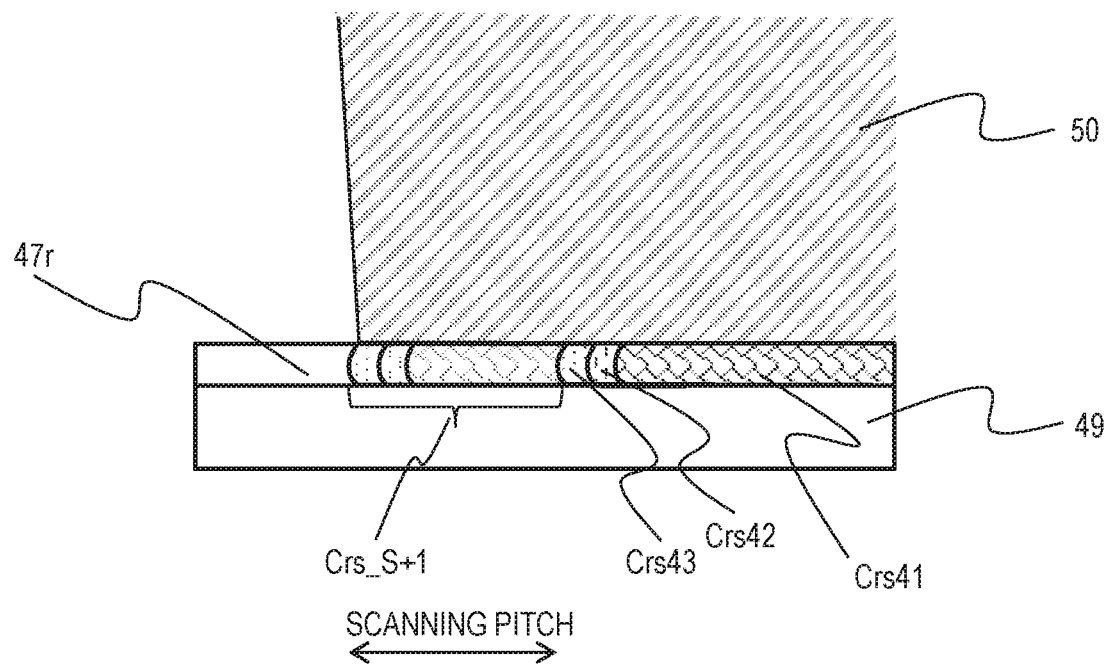
FIG. 1D is a second diagram for schematically illustrating the enlarged front end in the scanning direction of a pulse laser beam.

FIGS. 1C and 1D illustrate the process of crystallization of a poly-silicon film 40 in response to a pulse laser beam 50. FIGS. 1C and 1D are drawn as if the substrate 49 is fixed and the irradiation area of the pulse laser beam 50 moves leftward (in the direction indicated by the arrow in FIG. 1C). FIG. 1C illustrates a state where a given s-th shot is hitting the substrate 49. The traces of the (s−1)th and prior shots are omitted in FIG. 1C. The forward (left in FIG. 1C) part in the scanning direction of the silicon film is in an amorphous state (47r) and the area Crs_S irradiated with the s-th shot of the pulse laser beam 50 is crystallized. The region Crs41 irradiated with the first range of the pulse laser beam 50 are uniformly crystallized. The first range of the pulse laser beam 50 corresponds to the region in FIG. 1B where the energy density is even or highest in the middle of the pulse laser beam.

However, the region Crs42 irradiated with the second range of the pulse laser beam 50 is crystallized differently from the region Crs41. The second range of the pulse laser beam 50 corresponds to the anterior region in FIG. 1B where the energy density decreases with incline. The region Crs43 irradiated with the third range of the pulse laser beam 50 is not crystallized sufficiently. The third range of the pulse laser beam 50 corresponds to the front-end region in FIG. 1B where the energy density falls under the threshold for crystallization. In the region ahead (more left in FIG. 1C) of the region Crs 43, the poly-silicon film 40 remains in the amorphous state (47r). In this way, a trace of the s-th shot of the pulse laser beam is left at the front border of the irradiated area of the poly-silicon film 40.

FIG. 1D illustrates a state of the same part at the (s+1)th shot. The ELA system moves the pulse laser beam 50 in such a manner that the area to be irradiated overlaps the area irradiated previously. Accordingly, in FIG. 1D, the area Crs_S+1 irradiated with the (s+1)th shot of the pulse laser beam 50 is crystallized. The same phenomenon that occurred at the s-th shot occurs in the front border in the scanning direction. The end of the irradiation trace generated at the s-th shot is irradiated with the first range of the (s+1)th shot of the pulse laser beam 50. However, the process by the laser beam light is a phenomenon that occurs when the energy of light is absorbed by the workpiece and converts into heat. When the optical characteristics of the workpiece are not uniform, the generated thermal energy is not uniform, even if the irradiation energy is uniform.

In the situation of FIG. 1D, the optical characteristics are not uniform depending on the crystallized state of the poly-silicon film 40. Silicon shows a higher absorptance in its amorphous state than in polycrystalline state (poly-silicon) for the wavelength of the pulse laser beam commonly used in ELA. Accordingly, the trace of the s-th shot generated in the front border in the scanning direction or the differently crystallized region is not equalized by the (s+1)th shot but remains. The same applies to the (s+2)th and subsequent shots. This difference in crystallized state cannot be equalized, so that the poly-silicon film 40 have regions in this differently crystallized state at regular intervals. In forming TFTs on such a poly-silicon film 40, the difference in crystalized state of the poly-silicon film 40 could cause differences in transistor characteristics depending on the region where each TFT is formed.

Irradiation points (lines) of a pulse laser beam exist cyclically at equal intervals determined by the pulse frequency and the scanning speed. When an irradiation line is defined as the front end in the scanning direction of the irradiation area, the TFTs in pixel circuits may have slight differences in TFT characteristics depending on their relative positions to irradiation lines.

Figure 1E:
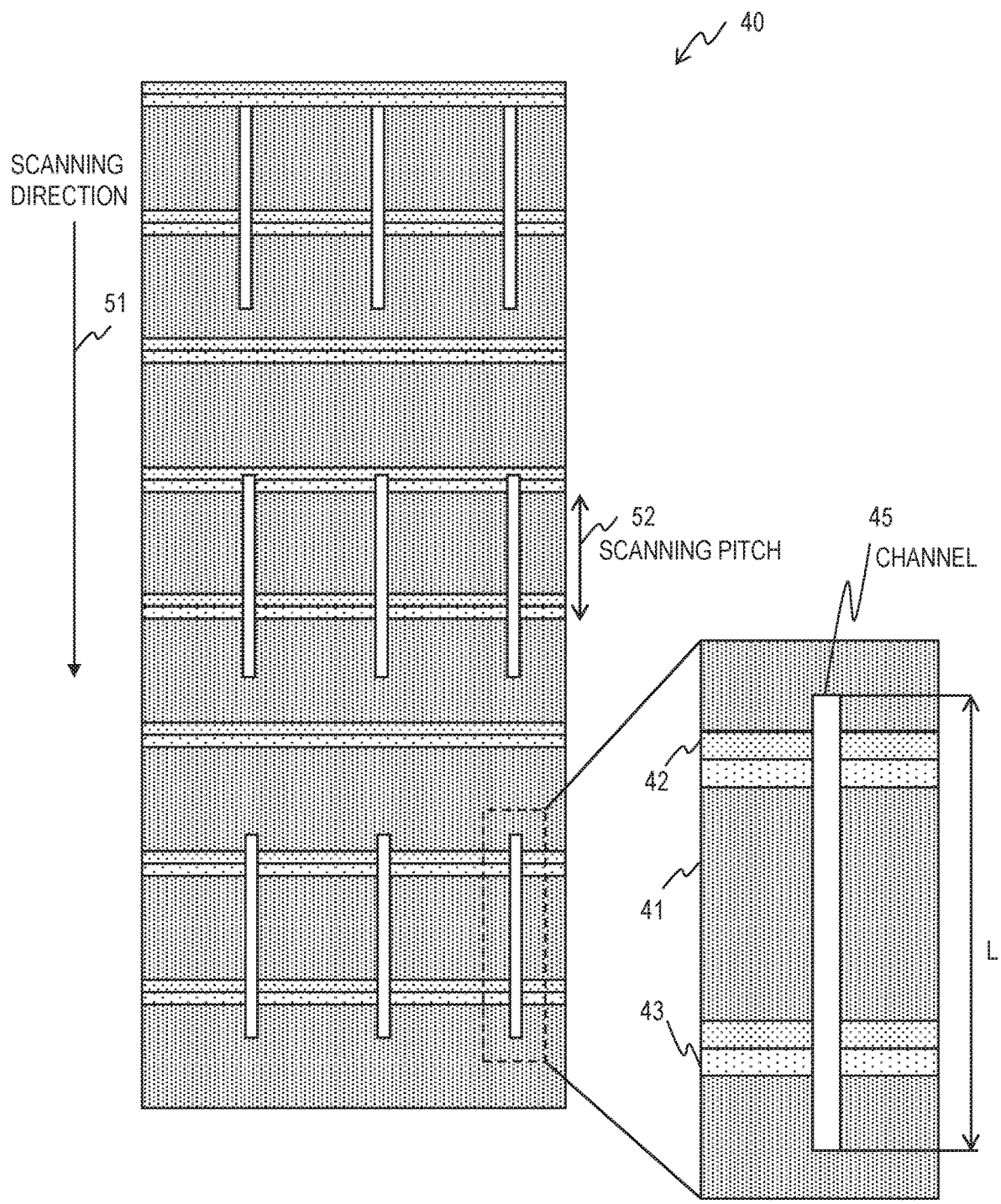
FIG. 1E schematically illustrates an example of the positional relations of the channels of TFTs to a poly-silicon film having characteristics variations in accordance with the irradiation cycle of a pulse laser beam.

FIG. 1E schematically illustrates an example of the positional relations of the channels 45 of TFTs to a poly-silicon film 40 having characteristics variation in accordance with the irradiation cycle (spatial cycle) of a pulse laser beam. In the example of FIG. 1E, the TFTs are disposed in such a manner that the scanning direction 51 of the pulse laser beam is parallel to the direction of the length L of the channels 45 of the TFTs. The short-axis of the pulse laser line beam is parallel to the scanning direction 51 and the long axis is perpendicular to the scanning direction 51.

For example, the dimension in the scanning direction 51 (the short-axial width 53 in FIG. 1A) of an irradiation area is several hundred micrometers and the scanning pitch 52 is several ten micrometers. The scanning pitch 52 is the distance (the irradiation interval) by which the repeatedly emitted pulse laser beam is translated per step. The dimension of the long axis of the pulse laser line beam is usually larger than the dimension of the display region in the direction parallel to this long axis.

In the example of FIG. 1E, each region of the poly-silicon film 40 corresponding to one cycle of characteristics variation is separated into three regions 41, 42, and 43 for convenience of explanation. With reference to the foregoing description about the crystallization process, the region 41 corresponds to the region irradiated with the even energy of the pulse laser beam and the regions 42 and 43 are the regions irradiated with the front range of the pulse laser beam. Particularly, the region 42 is meant to correspond to the region irradiated with the range where the energy decreases; the region 43 is meant to correspond to the region irradiated with the border range of the threshold for crystallization. In actual cases, however, the poly-silicon film 40 cannot be separated by clear boundaries as shown in FIG. 1E and the characteristics of the poly-silicon film 40 change indistinguishably from the region 41 to the region 42, and further to the region 43.

The regions 41, 42, and 43 in this order are cyclically located in synchronization with pulse laser beam irradiation lines (the lines determined by the scanning pitch 52). The total dimension in the scanning direction 51 of three successive regions 41, 42, and 43 equals to the scanning pitch 52.

It can be considered that the characteristics of the channel 45 of a TFT are substantially the same as the average of the characteristics extracted from the poly-silicon film 40 in a range corresponding to the channel length L. As to the example of FIG. 1E, it can be considered that the channels 45 composed of the same area proportions of three regions 41, 42, and 43 have substantially the same characteristics.

A significant difference of an OLED element from a liquid crystal element is that the OLED element emits light from itself and is driven by electric current. Liquid crystal display devices are configured to charge each pixel with a predetermined voltage through a pixel selection TFT working as a switch and hold the voltage by turning off the switch (selection TFT). That is to say, the display is determined by the voltage given from the external and held by the pixel.

OLED display devices are configured to hold a voltage given from the external within a pixel like liquid crystal display devices; however, the OLED display devices operate a pixel driving TFT with the voltage to control the current to flow in an OLED element. If TFTs have different transistor characteristics, the currents to flow will be different even when the TFTs are operated at the same voltage. Hence, in a pixel circuit, transistor characteristics of the driving TFT have the largest effect on light emission of the OLED element.

For this reason, a typical pixel circuit for an OLED display device is designed so that the driving TFT will operate in the saturated region for luminance control. Further, to avoid kink effect of a poly-silicon TFT for stable saturation characteristics, the driving TFT is designed to have a long channel. Disposing the long channel in parallel to the above-described scanning direction of the pulse laser beam leads to averaging the cyclic characteristics variation in the poly-silicon film. Because of this averaging, the driving TFT is less affected by the cyclic characteristics variation of the poly-silicon film 40.

Accordingly, it is important to minimize the differences in characteristics among the channels of the driving TFTs in different pixel circuits, particularly the pixel circuits for subpixels of the same color.

In an aspect of this disclosure, the channels of the driving TFTs included in a plurality of pixel circuits for subpixels of the same color or all colors are disposed at substantially the same phase in irradiation cycles (spatial cycles) of a pulse laser beam in the scanning direction of the pulse laser beam. Explaining this condition with the coordinates of a real space, the poly-silicon film has cyclic characteristics distribution generated by a pulse laser beam as described above. Defining the irradiation point (line) of the pulse laser beam as the front end in the short-axis direction (or the scanning direction) of the irradiation area, the poly-silicon film has the identical patterns of characteristics distribution at regular intervals (of the scanning pitch) with reference to the irradiation lines.

Meanwhile, defining the location of the channel of a TFT as the front end of the channel in the scanning direction of the pulse laser beam, "Disposing the channels at the same phase in irradiation cycles of a pulse laser beam" means that the distances between the channels and the irradiation line closest thereto are the same among all driving TFTs. Since the channels of these driving TFTs have the identical shapes and orientations, the patterns of the characteristics of the poly-silicon of the channels are identical. As a result, the driving TFTs of the subpixels of the same color can have the same characteristics.

As described above, each driving TFT is disposed in a pixel circuit to be located at the same position with reference to an irradiation line of the pulse laser beam; in other words, each driving TFT is disposed at the equivalent position (same phase) for the scanning pitch of the pulse laser beam. As a result, the display unevenness caused by laser annealing for crystallization of a silicon film can be reduced effectively.

Disposing the channels of driving TFTs at the same phase in irradiation cycles is effective especially in the case where the channels are bending. In the case where the channels are straight in the scanning direction and their lengths (the dimension in the scanning direction) are an integral multiple of the scanning pitch, the average characteristics of the poly-silicon of the channels are substantially the same. In the example of FIG. 1E, when the channel length L is selected to be an integral multiple of the scanning pitch 52, the area proportions of three regions 41, 42, and 43 constituting the channels are the same even if the channels are located at different phases.

However, in the case of bending channels, channels disposed at different phases in irradiation cycles can have different area proportions of three regions 41, 42, and 43. As described above, the channels having different area proportions of three regions 41, 42, and 43 have different characteristics. Disposing the channels of driving TFTs at the same phase in irradiation cycles in the scanning direction of the pulse laser beam as described above enables channels having a desired shape to have the identical characteristics patterns.

In another aspect of this disclosure, the channels of the driving TFTs included in pixel circuits for subpixels of the same color or all colors have a specific shape to reduce the differences in channel characteristics caused by locational differences among the channels. More specifically, the channels have a specific bending shape and further, the dimension of the channels in the scanning direction of the pulse laser beam are an integral multiple of the scanning pitch of the pulse laser beam. The channels have a specific bending shape to reduce the differences in proportions of regions located at different phases in irradiation cycles of the pulse laser beam. The details of the specific bending shape will be described later.

Because of the aforementioned specific bending shape and dimension, the channels disposed at different locations can have small differences in channel characteristics. These channels do not need to be disposed at the same phase in irradiation cycles of the pulse laser beam.

These channels can be disposed at the same phase in irradiation cycles of the pulse laser beam. As a result, the differences in channel characteristics among the channels disposed at different locations can be further reduced. Alternatively, channels having the aforementioned specific bending shape but having a dimension different from an integral multiple of the scanning pitch in the scanning direction of the pulse laser beam may be disposed at the same phase in irradiation cycles of the pulse laser beam. As a result, the differences in channel characteristics caused by fluctuations in location of the channels can be reduced.

Hereinafter, embodiments of this disclosure will be specifically described with reference to the accompanying drawings. Elements common to the drawings are denoted by the same reference signs. For clear understanding of the description, the elements in the drawings may be exaggerated in size or shape.

Embodiment 1

Overall Configuration

Figure 2:
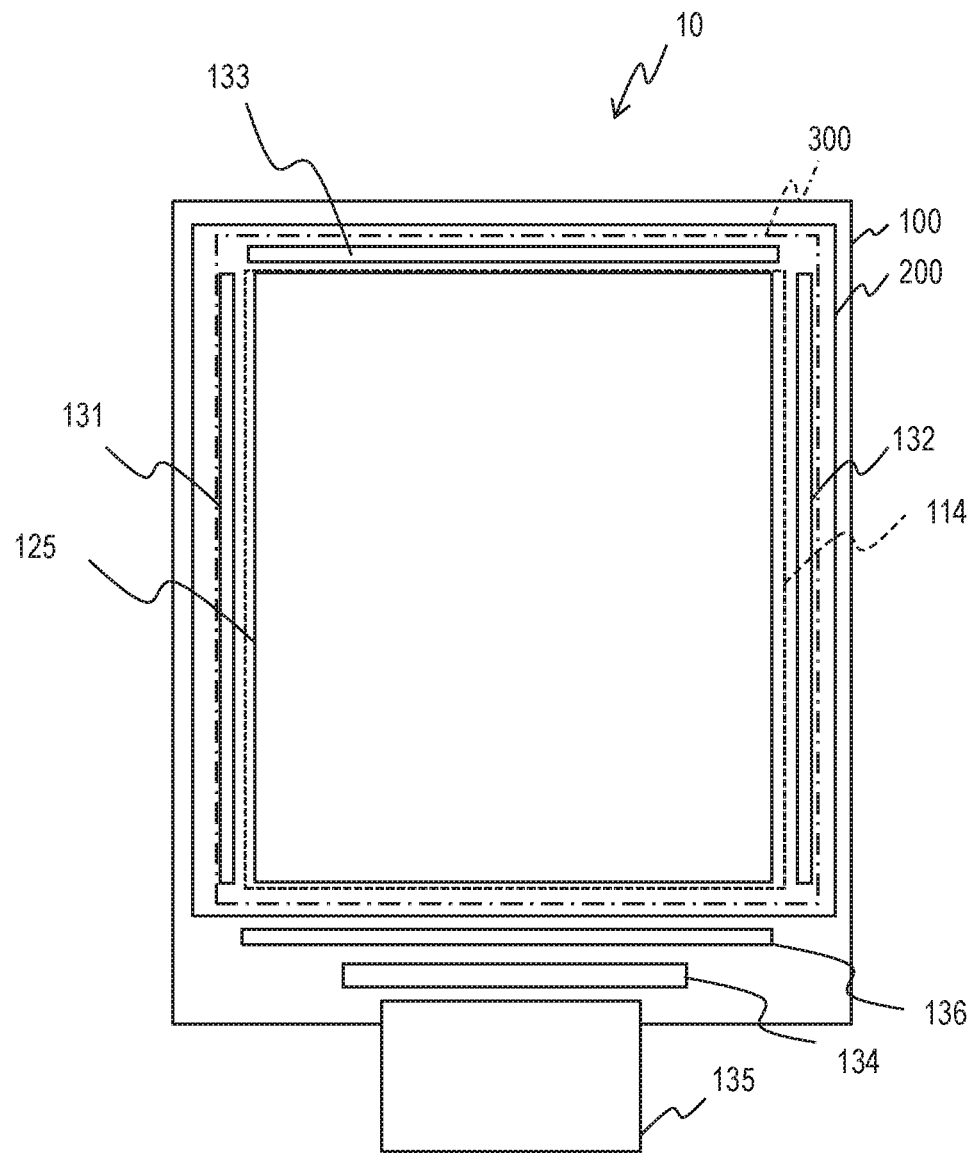
FIG. 2 schematically illustrates a configuration example of an OLED display device.

FIG. 2 schematically illustrates a configuration example of an OLED display device 10. The OLED display device 10 includes a thin film transistor (TFT) substrate 100 on which OLED elements are formed, an encapsulation substrate 200 for encapsulating the OLED elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver 131, an emission driver 132, a protection circuit 133, a driver IC 134, and a demultiplexer 136 are provided. The driver IC 134 is connected to the external devices via flexible printed circuits (FPC) 135.

The scanning driver 131 drives scanning lines on the TFT substrate 100. The emission driver 132 drives emission control lines to control the light emission periods of pixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides power and a data signal to the demultiplexer 136.

The demultiplexer 136 outputs output of one pin of the driver IC 134 to d data lines in series (d is an integer more than 1). The demultiplexer 136 changes the output data line for the data signal from the driver IC 134 $d$ times per scanning period to drive d times as many data lines as output pins of the driver IC 134.

Circuit Configuration

Figure 3A:
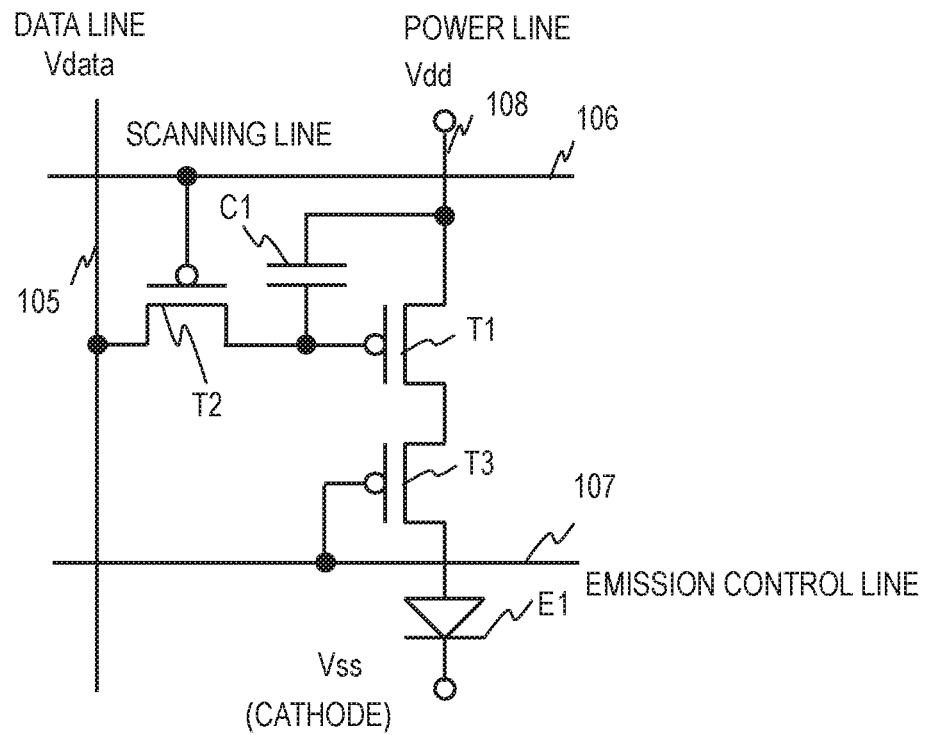
FIG. 3A illustrates a configuration example of a pixel circuit.

A plurality of pixel circuits are formed on the substrate 100 to control electric current to be supplied to the anode electrodes of subpixels. FIG. 3A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the sub-pixel. The selection transistor T2 is a p-channel TFT and its gate terminal is connected with a scanning line 106. The source terminal is connected with a data line 105. The drain terminal is connected with the gate terminal of the driving transistor T1.

The driving transistor T1 is a transistor (driving TFT) for driving the OLED element E1. The driving transistor T1 is a p-channel TFT and its gate terminal is connected with the drain terminal of the selection transistor T2. The source terminal of the driving transistor T1 is connected with a power line (Vdd) 108. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one field can be controlled by controlling ON/OFF of the transistor T3.

Figure 3B:
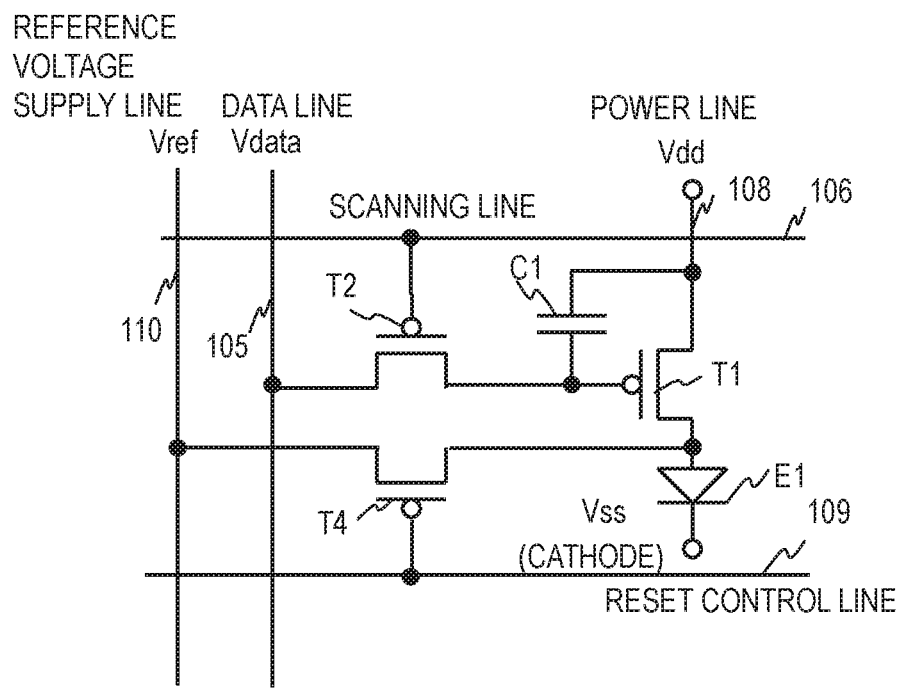
FIG. 3B illustrates another configuration example of a pixel circuit.

FIG. 3B illustrates another configuration example of a pixel circuit. This pixel circuit includes a reset transistor T4 in place of the emission transistor T3 in FIG. 3A. The reset transistor T4 controls the electric connection between a reference voltage supply line 110 and the anode of the OLED element E1. This control is performed in accordance with a reset control signal supplied from a reset control line 109 to the gate of the reset transistor T4.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 110 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun.

The circuit configurations in FIGS. 3A and 3B are examples; the pixel circuit may have a different circuit configuration. Although the pixel circuits in FIGS. 3A and 3B include p-channel TFTs, the pixel circuit may employ n-channel TFTs. The above-described pixel circuit is provided to compensate for variations in threshold voltage among the driving transistors to prevent impairment of the image quality. The technical means described in this specification to eliminate the characteristics differences among the transistors reduces the display unevenness that cannot be sufficiently reduced by the pixel circuits.

Pixel Structure

Figure 4:
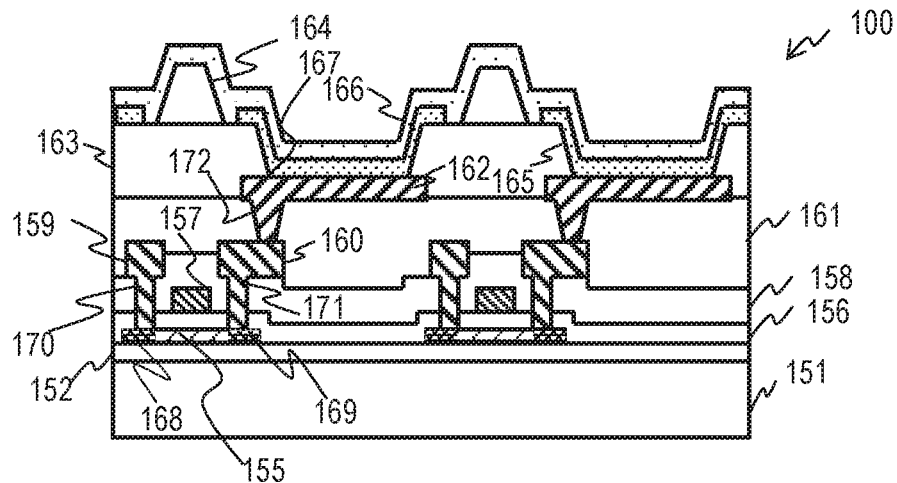
FIG. 4 schematically illustrates a cross-sectional structure of a part of an OLED display device that includes driving TFTs.

Next, general structures of a pixel circuit and a light-emitting element are described. FIG. 4 schematically illustrates a cross-sectional structure of a part of an OLED display device 10 that includes driving TFTs. The OLED display device 10 includes a TFT substrate 100 and an encapsulation substrate 200 opposed to the TFT substrate 100. In the following description, the definitions of top and bottom correspond to the top and the bottom of the drawing.

The OLED display device 10 includes an insulating substrate 151 and an encapsulation structural unit opposed to the insulating substrate 151. An example of the encapsulation structural unit is a flexible or inflexible encapsulation substrate 200. The encapsulation structural unit can be a thin film encapsulation (TFE) structure.

The OLED display device 10 includes lower electrodes (for example, anode electrodes 162), upper electrodes (for example, cathode electrodes 166), and organic light-emitting films 165 disposed between the insulating substrate 151 and the encapsulation structural unit.

The organic light-emitting films 165 are provided between the cathode electrodes 166 and the anode electrodes 162. The plurality of anode electrodes 162 are disposed on the same plane (for example, on a planarization film 161) and an organic light-emitting film 165 is disposed on an anode electrode 162. In the example of FIG. 4, the cathode electrode 166 of one subpixel is a part of an unseparated conductor film.

The OLED display device 10 further includes a plurality of post spacers (PS) 164 standing toward the encapsulation structural unit and a plurality of pixel circuits each including a plurality of switches. Each of the plurality of pixel circuits is formed between the insulating substrate 151 and an anode electrode 162 and controls the electric current to be supplied to the anode electrode 162.

FIG. 4 illustrates an example of a top-emission pixel structure, which includes top-emission type of OLED elements. The top-emission pixel structure is configured in such a manner that a cathode electrode 166 common to a plurality of pixels is provided on the light emission side (the upper side of the drawing). The cathode electrode 166 has a shape that fully covers the entire display region 125. The top-emission pixel structure is characterized by that the anode electrodes 162 have light reflectivity and the cathode electrode 166 has light transmissivity. Hence, a configuration to transmit light coming from the organic light-emitting films 165 toward the encapsulation structural unit is attained.

Compared to a bottom-emission pixel structure configured to extract light from the insulating substrate 151, the top-emission type does not need a light transmissive region within a pixel region to extract light. For this reason, the top-emission type has high flexibility in laying out pixel circuits. For example, the light-emitting unit can be provided above the pixel circuits or lines.

The top-emission pixel structure easily allows driving TFTs (the channels thereof) to be disposed at desirable locations suitable for irradiation with a pulse laser beam for silicon laser annealing. The bottom-emission pixel structure has a transparent anode electrode and a reflective cathode electrode to transmit light to the external through the insulating substrate 151. The TFT layout of this disclosure is also applicable to the bottom-emission pixel structure.

A subpixel of a full-color OLED display device usually displays one of the colors of red, green, and blue. A red subpixel, a green subpixel, and a blue subpixel constitute one main pixel. A pixel circuit including a plurality of thin film transistors controls light emission of an OLED element associated therewith. An OLED element is composed of an anode electrode of a lower electrode, an organic light-emitting film, and a cathode electrode of an upper electrode.

The insulating substrate 151 is made of glass or resin, for example, and is flexible or inflexible. A poly-silicon layer is provided above the insulating substrate 151 with a first insulating film 152 interposed therebetween. The poly-silicon layer includes channels 155 at the locations where gate electrodes 157 are to be formed later. Each channel 155 determines the transistor characteristics of the TFT. At both ends of each channel 155, a source region 168 and a drain region 169 are provided. The source region 168 and the drain region 169 are doped with high-concentration impurities for electrical connection with a wiring layer thereabove.

Lightly doped drains (LDDs) doped with low-concentration impurities can be provided between the channel 155 and the source region 168 and between the channel 155 and the drain region 169. FIG. 4 omits the LDDs to avoid complexity. Above the poly-silicon layer, gate electrodes 157 are provided with a gate insulating film 156 interposed therebetween. An interlayer insulating film 158 is provided above the layer of the gate electrodes 157.

Within the display region 125, source electrodes 159 and drain electrodes 160 are provided above the interlayer insulating film 158. The source electrodes 159 and the drain electrodes 160 are formed of a metal having a high melting point or an alloy of such a metal. Each source electrode 159 and each drain electrode 160 are connected with a source region 168 and a drain region 169 of the poly-silicon layer through contact holes 170 and 171 provided in the interlayer insulating film 158 and the gate insulating film 156.

Over the source electrodes 159 and the drain electrodes 160, an insulative planarization film 161 is provided. Above the insulative planarization film 161, anode electrodes 162 are provided. Each anode electrode 162 is connected with a drain electrode 160 through a contact provided in a contact hole 172 in the planarization film 161. The TFTs of a pixel circuit are formed below the anode electrode 162.

Above the anode electrodes 162, an insulative pixel defining layer (PDL) 163 is provided to separate OLED elements. OLED elements are formed in openings 167 of the pixel defining layer 163. Insulative spacers 164 are provided on the pixel defining layer 163 to be located between anode electrodes 162 and maintain the space between the OLED elements and the encapsulation substrate 200.

Above each anode electrode 162, an organic light-emitting film 165 is provided. The organic light-emitting film 165 is in contact with the pixel defining layer 163 in the opening 167 of the pixel defining layer 163 and its periphery. A cathode electrode 166 is provided over the organic light-emitting film 165. The cathode electrode 166 is a light-transmissive electrode. The cathode electrode 166 transmits all or part of the visible light coming from the organic light-emitting film 165. The laminated film of the anode electrode 162, the organic light-emitting film 165, and the cathode electrode 166 formed in an opening 167 of the pixel defining layer 165 corresponds to an OLED element. A not-shown cap layer may be provided over the cathode electrode 166.

Manufacturing Method

An example of the method of manufacturing the OLED display device 10 is described. The method of manufacturing the OLED display device 10 first deposits silicon nitride, for example, onto the insulating substrate 151 by chemical vapor deposition (CVD) to form a first insulating film 152. Next, the method forms a layer (poly-silicon layer) including channels 155 by a known low-temperature poly-silicon TFT fabrication technique. Specifically, the method forms the poly-silicon layer by depositing amorphous silicon by CVD and crystallizing the amorphous silicon by excimer laser annealing (ELA) described with reference to FIG. 1A. The method processes the poly-silicon film to have island-like shapes and dopes the source and drain regions 168 and 169 to be connected with source electrodes 159 and drain electrodes 160 with impurities in high concentration to reduce the resistance. The poly-silicon layer reduced in resistance can also be used to connect elements within the display region 125.

Next, the method deposits silicon oxide, for example, onto the poly-silicon layer including the channels 155 by CVD to form a gate insulating film 156. Furthermore, the method deposits a metal by sputtering and patterns the metal to form a metal layer including gate electrodes 157.

The metal layer includes storage capacitor electrodes, scanning lines 106, and emission control lines, in addition to the gate electrodes 157. The metal layer may be a single layer made of one material selected from a group consisting of Mo, W, Nb, MoW, MoNb, Al, Nd, Ti, Cu, a Cu alloy, an Al alloy, Ag, and an Ag alloy. Alternatively, the metal layer may be a laminated layer to reduce the wiring resistance. The laminated layer has a multi-layer structure including two or more layers each made of a low-resistive material such as Mo, Cu, Al, Ag, or an alloy thereof.

In forming the metal layer, the method keeps offset regions to the gate electrodes 157 in the source and drain regions 168 and 169. Subsequently, the method dopes the poly-silicon film with additional impurities using the gate electrodes 157 as a mask to provide a layer of low-concentration impurities between the source regions 169 and the channels 155 located under the gate electrodes 157 and between the drain regions 168 and the channels 155. As a result, the TFTs has a lightly doped drain (LDD) structure. Next, the method deposits silicon oxide by CVD to form an interlayer insulating film 158.

The method opens contact holes in the interlayer insulating film 158 and the gate insulating film 156 by anisotropic etching. The contact holes 170 and 171 to connect the source electrodes 159 and the drain electrodes 160 to the source regions 168 and the drain regions 169, respectively, are formed in the interlayer insulating film 158 and the gate insulating film 156.

Next, the method deposits conductive materials such as Ti/Al/Ti by sputtering and patterns the film to form a metal layer. The metal layer includes source electrodes 159, drain electrodes 160, and inner walls of the contact holes 170 and 171. In addition to these, data lines 105 and power lines 108 are also formed on the same layer.

Next, the method deposits a photosensitive organic material to form a planarization film 161. Subsequently, the method opens contact holes 172 connecting to the source electrodes 159 and the drain electrodes 160 of the TFTs by exposure and development. The method forms anode electrodes 162 on the planarization film 161 having contact holes 172. An anode electrode 162 includes three layers of a transparent film made of ITO, IZO, ZnO, $In_2O_3$, or the like, a reflective film made of a metal such as Ag, Mg, Al, Pt, Pd, Au, Ni, Nd, Ir, or Cr or an alloy containing such a metal, and another transparent film as mentioned above. The three-layer structure of the anode electrode 162 is merely an example and the anode electrode 162 may have a two-layer structure. The anode electrodes 162 are connected to the drain electrodes 160 through the contact holes 172.

Next, the method deposits a photosensitive organic resin by spin coating and patterns the photosensitive organic resin to form a pixel defining layer 163. The patterning creates openings 167 in the pixel defining layer 163 to expose the anode electrodes 162 of the sub-pixels at the bottom of the created openings 167. The inner walls of the openings 167 in the pixel defining layer 163 are normally tapered. The pixel defining layer 163 forms separate light-emitting regions of sub-pixels. The method further deposits a photosensitive organic resin by spin coating and patterns the photosensitive organic resin to form spacers 164 on the pixel defining layer 163.

Next, the method applies organic light-emitting materials onto the insulating substrate 151 provided with the pixel defining layer 163 to form organic light-emitting films 165. An organic light-emitting film 165 is formed by depositing an organic light-emitting material for the color of R, G, or B on an anode electrode 162. The forming an organic light-emitting film 165 uses a metal mask. The organic light-emitting film 165 consists of, for example, a hole injection layer, a hole transport layer, a light-emitting layer, an electron transport layer, and an electron injection layer in this order from the bottom. The laminate structure of the organic light-emitting film 165 is determined depending on the design.

Next, the method applies a metal material for the cathode electrode 166 onto the TFT substrate 100 where the pixel defining layer 163, the spacers 164, and the organic light-emitting films 165 (in the openings of the pixel defining layer 163) are exposed. The metal material deposited on the organic light-emitting film 165 of one sub-pixel functions as the cathode electrode 166 of the sub-pixel within the region of an opening of the pixel defining layer 163.

The layer of the cathode electrode 166 is formed by vapor-deposition of a metal such as Al or Mg or an alloy thereof, for example. If the resistance of the cathode electrode 166 is so high to impair the uniformity of the luminance of the emitted light, an additional auxiliary electrode layer may be formed using a material for a transparent electrode, such as ITO, IZO, ZnO, or $In_2O_3$.

Layout of Driving Transistors

Figure 5:
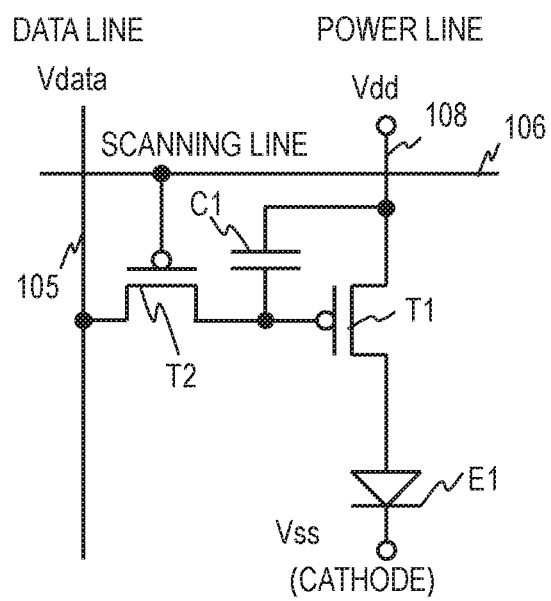
FIG. 5 illustrates still another configuration example of a pixel circuit.

Hereinafter, examples of the layout of driving transistors T1 in a plurality of pixel circuits within a display region are described. Particularly, relations between the locations of the channels of the driving TFTs and the irradiation points (lines) of the ELA pulse laser beam for preparing poly-silicon are described in detail. For simplicity of explanation, examples employing pixels having the pixel circuit configuration illustrated in FIG. 5 are described. The pixel circuit in FIG. 5 has a configuration in which the emission transistor T3 and the emission control line 107 are omitted from the pixel circuit illustrated in FIG. 3A. The following description is applicable to other pixel circuit configurations like those illustrated in FIGS. 3A and 3B.

Figure 6:
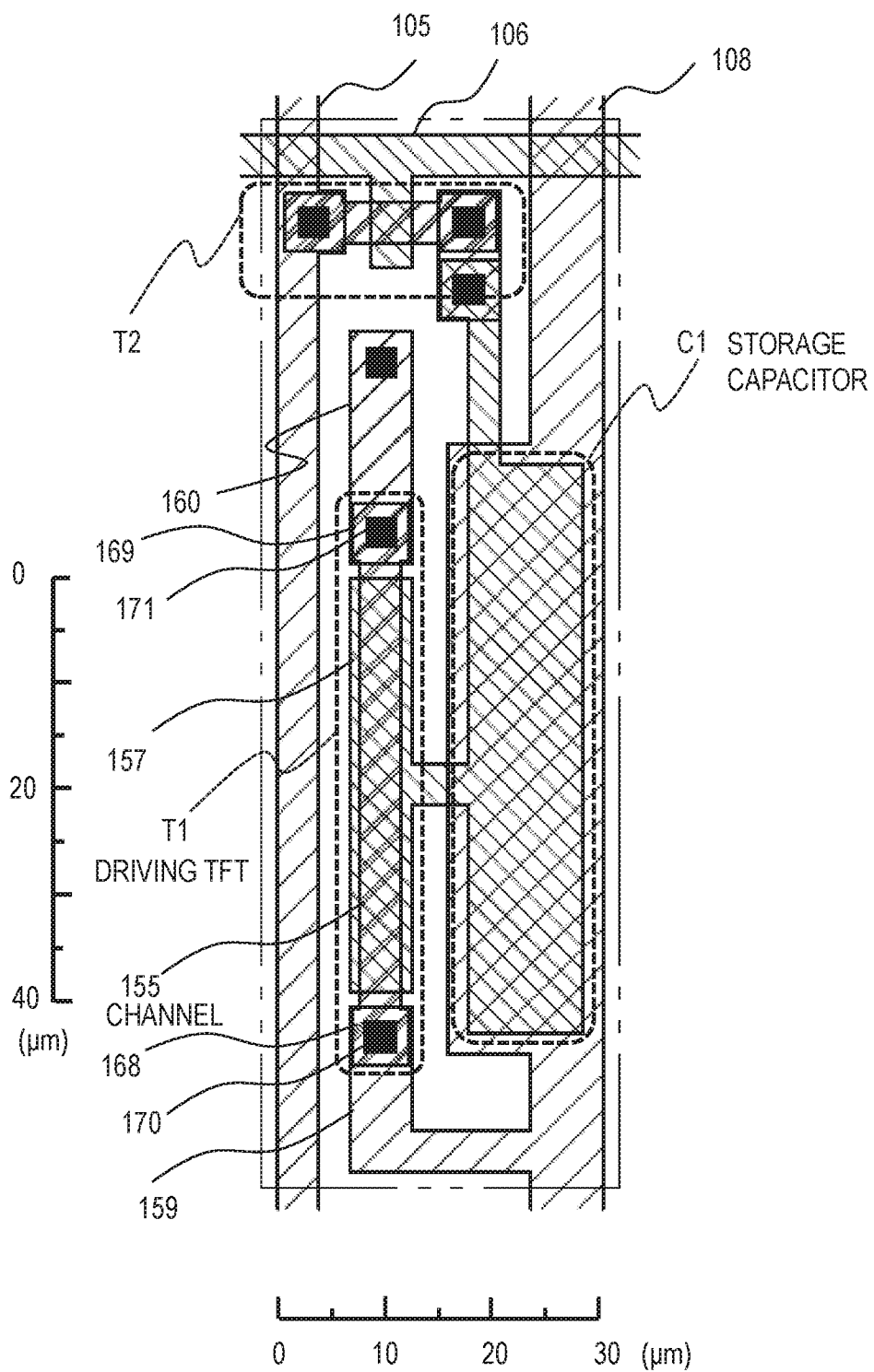
FIG. 6 is a plan diagram of an example of the layout of the elements of a pixel circuit having the circuit configuration illustrated in FIG. 5.

FIG. 6 is a plan diagram of an example of the layout of the elements of a pixel circuit having the circuit configuration illustrated in FIG. 5. The pixel circuit includes a driving transistor T1, a selection transistor T2, and a storage capacitor C1 for the driving transistor T1. The active layers of the TFTs are made from a poly-silicon film. The overlap region of the poly-silicon film with a gate electrode 157 is a channel 155.

The ends of the channel 155 are continued to a source region 168 and a drain region 169 doped with high-concentration impurities (in some cases, via an LDD region doped with low-concentration impurities) for electrical connection with a source electrode 159 and a drain electrode 160, respectively. A scanning line 106 and the lower electrode of the storage capacitor C1 are formed on the same metal layer (lower metal layer) as the gate electrode 157. A data line 105, a power line 108, and the upper electrode of the storage capacitor C1 are formed on the same metal layer (upper metal layer) as the source electrode 159 and the drain electrode 160.

The source electrode 159 of the driving transistor T1 interconnects the power line 108 and the source region 168 of the poly-silicon layer through a contact hole 170. The drain electrode 160 interconnects the anode electrode 162 (not shown in FIG. 5) and the drain region 169 of the poly-silicon layer through a contact hole 171.

The channel 155 is a part of the poly-silicon film of the driving transistor T1 covered by the gate electrode 157 when seen from the top. In the example of FIG. 6, the channel 155 is straight and extends in parallel to the direction (the vertical direction in FIG. 6) in which the data line 105 or the power line 108 extends.

In the example of FIG. 6, the channel 155 of the driving transistor T1 has a channel length of 40 μm and a channel width of 4 μm. The pixel pitch $P_{PIX}$ in the direction (the vertical direction in FIG. 6) in which the data line 105 or the power line 108 extends is 103.5 μm. As will be described later, the scanning direction of the ELA system with a pulse laser beam is parallel to this pixel pitch. The layout and the numerical values of the pixel elements provided in FIG. 6 are merely examples; the features of this disclosure are applicable to pixels having different configurations and/or sizes.

In the following description, the channels 155 of the driving transistors T1 of all subpixels are designed to have the identical shapes (inclusive of sizes) and orientations and therefore, have the same channel length and channel width. In another example, the channels 155 of the driving transistors T1 may have different shapes depending on the color of the subpixels. The shapes, orientations, lengths, and widths of the channels 155 could be slightly different among individual subpixels because of the irregularity in manufacture.

Figures 7, 8:
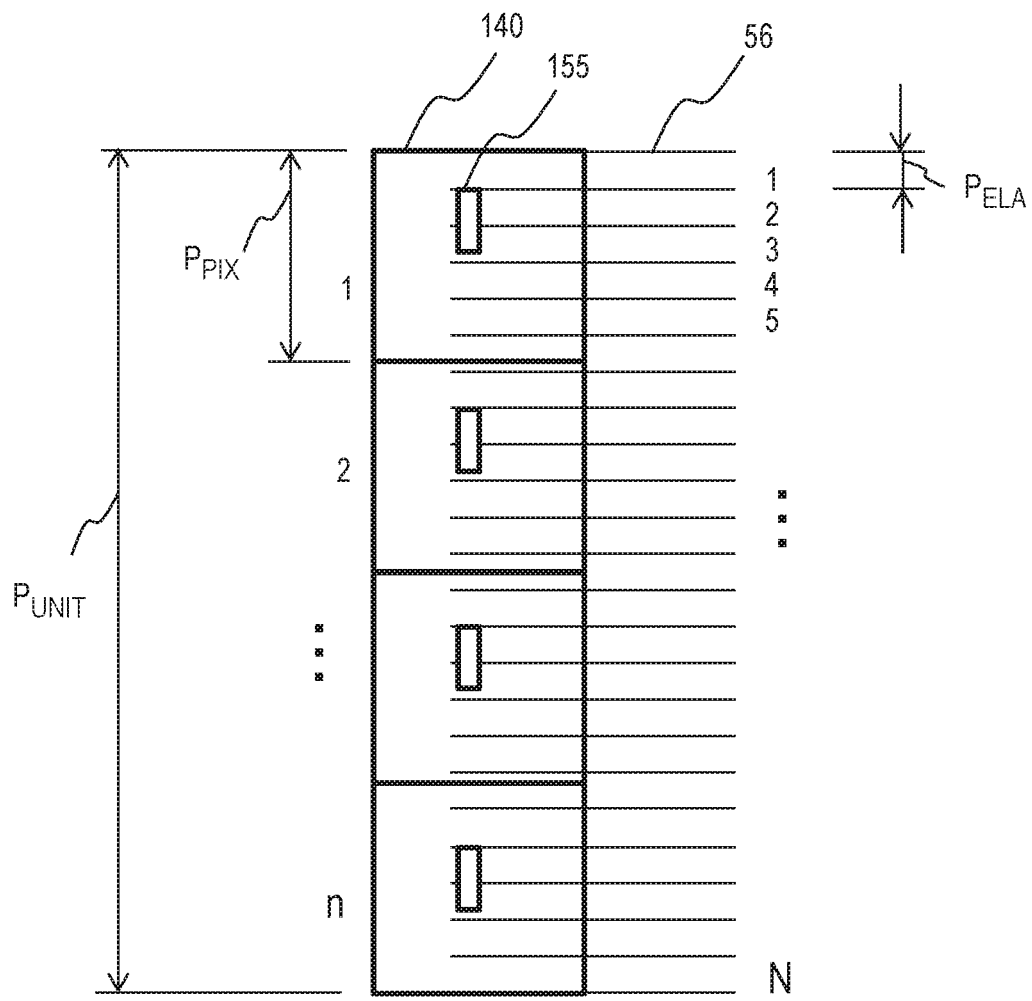
FIG. 7 schematically illustrates a positional relation among pixels disposed in the scanning direction of a pulse laser beam, channels of the driving TFTs in the pixels, and the successive irradiation points (lines) of a pulse laser beam.
FIG. 8 provides examples of the combination of N, n, and $P_{ELA}$ that satisfies the relation of $N \times P_{ELA} = n \times P_{PIX}$.

FIG. 7 schematically illustrates a positional relation among pixels 140 disposed in the scanning direction 51 of a pulse laser beam 50, the channels 155 of the driving transistors T1 in the pixels, and successive irradiation points (lines) 56 of the pulse laser beam 50. The rectangles 1, 2, . . . n of the pixels 140 schematically represent the areas occupied by the individual pixels 140 disposed at a pixel pitch $P_{PIX}$. For example, each rectangle is defined by connecting the boundaries at the middle between light-emitting regions adjacent to each other. Note that FIGS. 7 to 17 and the description thereof simply refer to subpixel as pixel unless otherwise specified.

An irradiation line 56 is a specific position in the short-axis direction, for example the front end in the scanning direction, of an area irradiated with a shot of pulse laser beam. The irradiation line 56 can be any position that can define the scanning pitch $P_{ELA}$ of the pulse laser beam 50.

The channels 155 of the driving transistors T1 included in the pixel circuits of the individual pixels 140 are disposed at the same phase in irradiation cycles (locational cycles) of the pulse laser beam when seen in the scanning direction 51 of the pulse laser beam. In the example of FIG. 7, the upper end of each channel 155 coincides with an irradiation line 56. The distance between the channels of two successive pixels is an integral multiple of the scanning pitch $P_{ELA}$.

Disposing the channels 155 to be located at different positions in the scanning direction 51 at the same phase in irradiation cycles leads the poly-silicon of the channels 155 to have identical characteristics variation patterns, enabling the driving transistors T1 to have the same characteristics.

As described above, each channel 155 is disposed at the same position with reference to an irradiation line of a pulse laser beam, in other words, each channel 155 is disposed at an equivalent position for the scanning pitch of a pulse laser beam. As a result, display unevenness that could occur because of leaser annealing to prepare a poly-silicon film can be reduced effectively.

The scanning pitch is usually smaller than the pixel pitch. In the case where driving TFTs of different pixel circuits are disposed at the same relative position to the areas occupied by the corresponding pixels, the driving TFTs of pixels adjacent to each other in the scanning direction are located at different positions with respect to the scanning pitch by the residue obtained by dividing the pixel pitch by the scanning pitch. The positions of the channels 155 are determined to coincide with cyclic irradiation lines 56 and this condition needs to be satisfied in the entire display region. If a pixel unit consisting of some pixels is defined and configured to satisfy the foregoing condition within the pixel unit, the layout can be easily expanded to the entire display region.

In FIG. 7, successive n pixels 140 are disposed in a line in the scanning direction 51 of the pulse laser beam 50, where n is a natural number. The n pixels 140 constitute one pixel unit; the size of the pixel unit in the scanning direction 51 is $P_{UNIT}$. A relation $P_{UNIT}=n\times P_{PIX}=N\times P_{ELA}$ is satisfied, where N is a natural number and represents the number of shots of a pulse laser beam in a $P_{UNIT}$ (hereinafter, referred to as the number of ELA cycles). In the example of FIG. 7, the scanning pitch $P_{ELA}$ is smaller than the pixel pitch $P_{PIX}$ and N is greater than n.

A plurality of pixel units are disposed in a matrix to be a display region 125. Accordingly, the positional pattern of the channels of the driving transistors T1 in a pixel unit is repeated in the scanning direction. In addition, the relation between the pixels 140 included in a pixel unit and the irradiation lines 56 is also repeated in the scanning direction because the relation of $P_{UNIT}=n\times P_{PIX}=N\times P_{ELA}$ is satisfied. As understood from the foregoing description, the pixel circuit layout of the entire display region 125 can be designed efficiently by determining a pixel circuit layout in a pixel unit.

The scanning pitch $P_{ELA}$ needs to be selectable on the ELA system. A common ELA system is configured to allow setting of the scanning pitch $P_{ELA}$ with an integer in unit of μm. Even in the case of another ELA system that accepts a number with a decimal point, selecting an integer or a simple value that does not uselessly increase the number of digits after the decimal point for the scanning pitch $P_{ELA}$ reduces the probability of erroneous operation because of hardware accuracy.

In designing and manufacturing an OLED display device 10, the values for N, n, and $P_{ELA}$ are determined to satisfy the relation of $N\times P_{ELA}=n\times P_{PIX}$ for a predetermined pixel pitch $P_{PIX}$. After determination of these values, the positions of the driving transistors T1 (the channels 155 thereof) in individual pixels 140 in a pixel unit are determined to be the same phase in irradiation cycles.

In this example, the pixel pitch $P_{PIX}$ is 103.5 μm. FIG. 8 provides examples of the combination of N, n, and $P_{ELA}$ that satisfy the relation of $N\times P_{ELA}=n\times P_{PIX}$. A desired integer for $P_{ELA}$ can be efficiently obtained by calculating $n\times P_{PIX}=P_{UNIT}$ with different values of n and factorizing the values of $P_{UNIT}$ into prime factors, for example.

For example, when the number of pixels per pixel unit n is 2, $P_{UNIT}=n\times P_{PIX}$ is 207. This value is prime-factorized as $3^2\times 23$. Accordingly, the available values for $P_{ELA}$ are 3, 9, 23, 69, and 207. If the preferable $P_{ELA}$ is about 20 μm, 23 μm is selected as $P_{ELA}$. The number of ELA cycles N in this case is 9. In similar, when the number of pixels n is 4, the value closest to 20 μm is 18 μm; when the number of pixels n is 14, the value closest to 20 μm is 21 μm. The number of ELA cycles N in these cases are 23 and 69.

Figure 9:
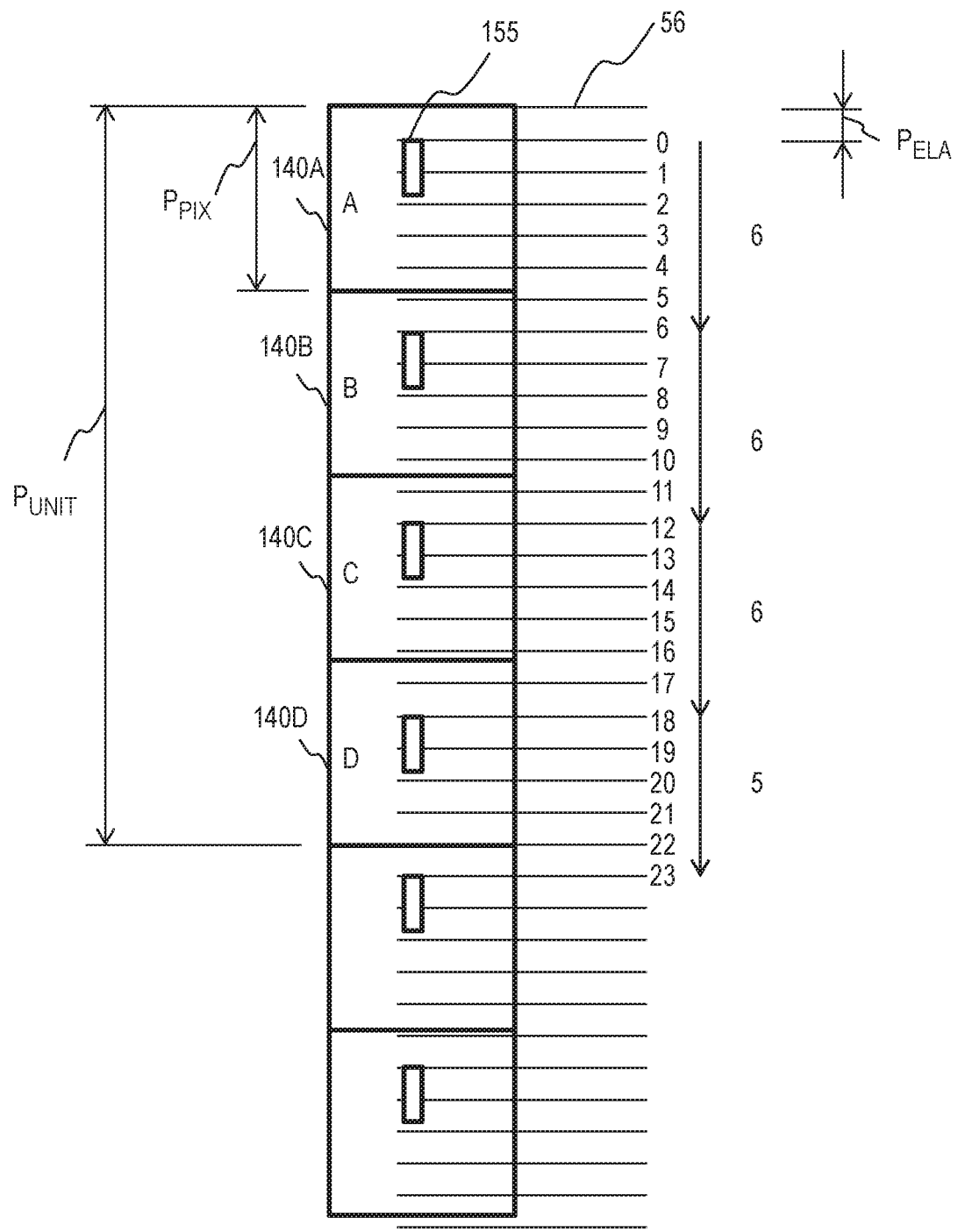
FIG. 9 provides a layout in the conditions where the pixel pitch $P_{PIX}$ is 103.5 µm, the scanning pitch $P_{ELA}$ is 18 µm, the number of pixels per pixel unit n is 4, and the number of ELA cycles N is 23.

Hereinafter, three layout examples in accordance with the foregoing numerical values are described. FIG. 9 provides a layout in the conditions where the pixel pitch $P_{PIX}$ is 103.5 μm, the scanning pitch $P_{ELA}$ is 18 μm, the number of pixels per pixel unit n is 4, and the number of ELA cycles N is 23. FIG. 10 provides numerical values for specifying this layout.

A pixel unit consists of four pixels 140A to 140D. The distance (TFT-to-TFT distance) between the channels 155 of the driving transistors T1 of the pixels 140A and 140B is six times of the scanning pitch $P_{ELA}$ ($6\times P_{ELA}$). The distance between the channels 155 of the driving transistors T1 of the pixels 140B and 140C is six times of the scanning pitch $P_{ELA}$. The distance between the channels 155 of the driving transistors T1 of the pixels 140C and 140D is six times of the scanning pitch $P_{ELA}$. The distance between the channels 155 of the driving transistors T1 of the pixel 140D and the pixel 140A in the next pixel unit is five times of the scanning pitch $P_{ELA}$ ($5 \times P_{ELA}$).

Figure 11:
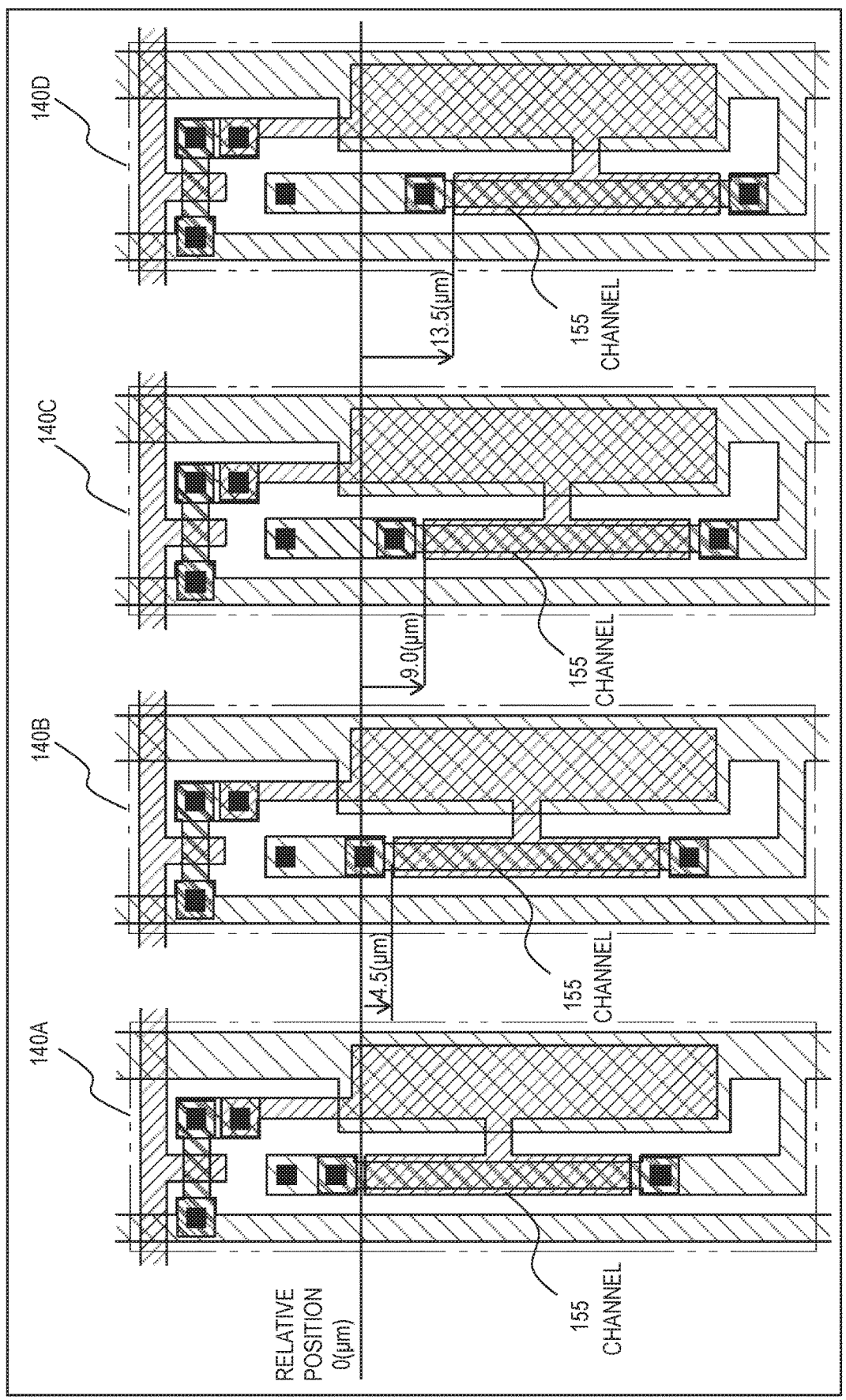
FIG. 11 illustrates the positions in pixel circuits of the channels in the layout provided in FIG. 9.

The accumulated distance in FIG. 10 indicates the total sum of the pixel pitches $P_{PIX}$ from the pixel 140A to the pixel of the entry. The relative position in FIG. 10 indicates the relative position of the channel 155 (the driving transistor T1) in the pixel circuit for the pixel of the entry. As illustrated in FIG. 11, the position in the pixel circuit of the channel 155 in the pixel 140A is defined as reference position. The number of ELA cycles and the TFT-to-TFT distance in FIG. 10 are the values from the pixel of the entry to the next pixel in the scanning direction. Note that FIG. 11 does not depict an actual pixel array composed of pixels disposed side by side but depicts a state where individual pixels disposed one above another in the pixel array illustrated in FIG. 9 are disposed side by side.

The relative position of the channel 155 in the pixel 140B is different from the reference position by 4.5 μm in the scanning direction 51. The relative positions of the channels 155 in the pixels 140C and 140D are different from the reference position by 9.0 μm and 13.5 μm, respectively, in the scanning direction 51.

Figures 12, 13:
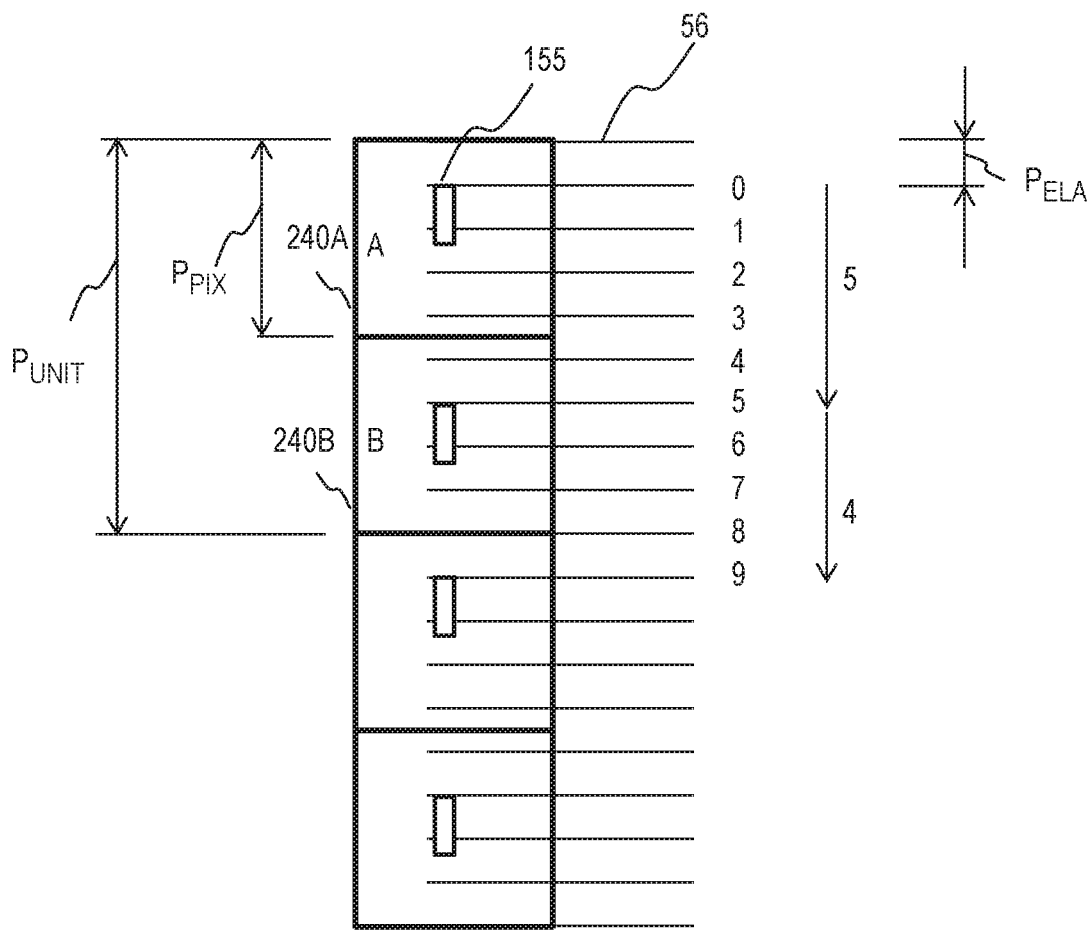
FIG. 12 provides a layout in the conditions where the pixel pitch $P_{PIX}$ is 103.5 µm, the scanning pitch $P_{ELA}$ is 23 µm, the number of pixels per pixel unit n is 2, and the number of ELA cycles N is 9.
FIG. 13 provides numerical values for specifying the layout provided in FIG. 12.

FIG. 12 provides a layout in the conditions where the pixel pitch $P_{PIX}$ is 103.5 μm, the scanning pitch $P_{ELA}$ is 23 μm, the number of pixels per pixel unit n is 2, and the number of ELA cycles N is 9. FIG. 13 provides numerical values for specifying this layout.

A pixel unit consists of two pixels 240A and 240B. The distance (TFT-to-TFT distance) between the channels 155 of the driving transistors T1 of the pixels 240A and 240B is five times of the scanning pitch $P_{ELA}$. The distance between the channels 155 of the driving transistors T1 of the pixel 240B and the pixel 240A in the next pixel unit is four times of the scanning pitch $P_{ELA}$. The distance between the channels of pixels adjacent to each other is an integral multiple of the scanning pitch $P_{ELA}$ and the largest difference among the channel-to-channel distances is one scanning pitch $P_{ELA}$.

Figure 14:
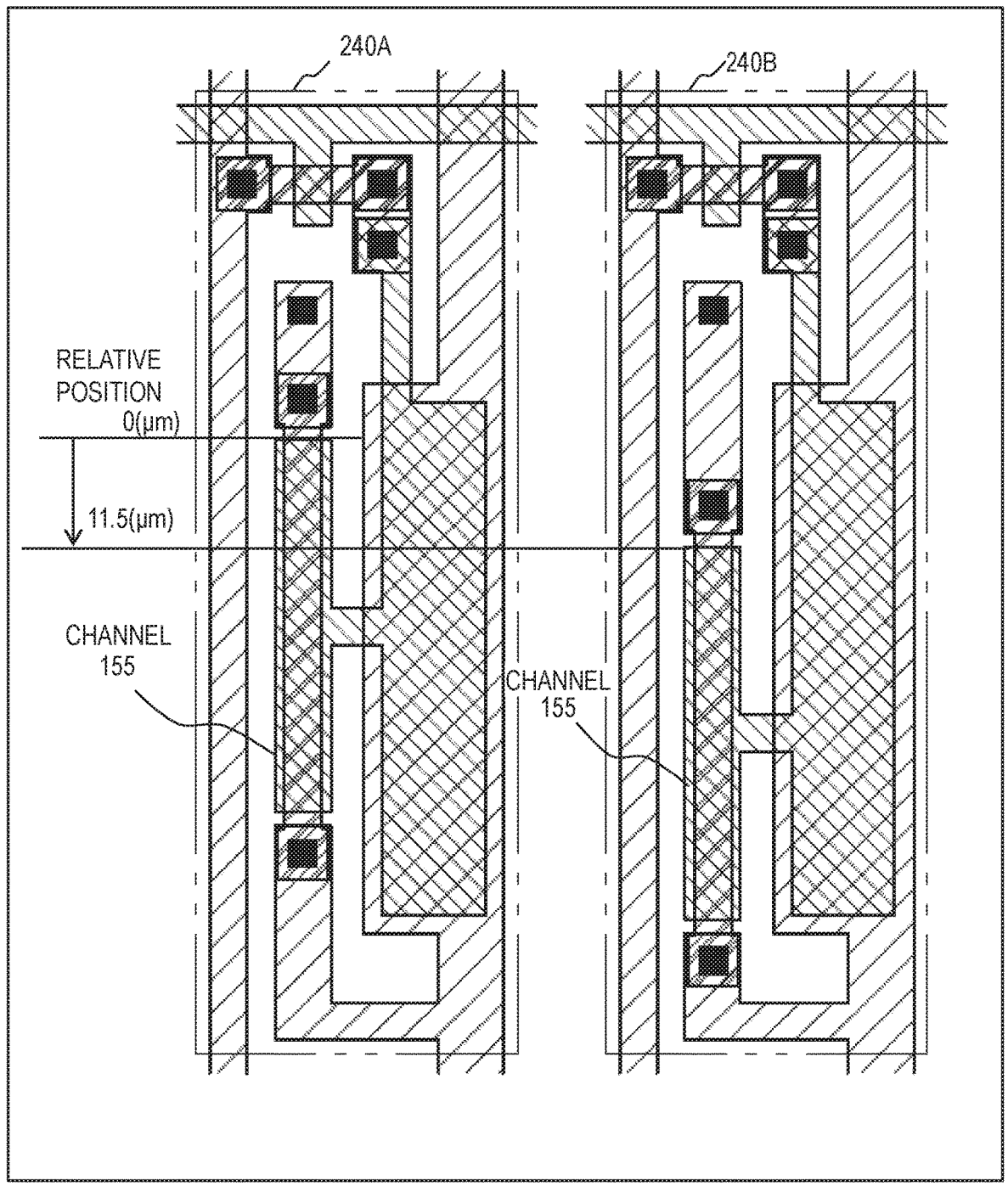
FIG. 14 illustrates the positions in pixel circuits of the channels in the layout provided in FIG. 12.

The accumulated distance in FIG. 13 indicates the total sum of the pixel pitches $P_{PIX}$ from the pixel 240A to the pixel of the entry. The relative position in FIG. 13 indicates the relative position of the channel 155 (the driving transistor T1) in the pixel circuit for the pixel of the entry. As illustrated in FIG. 14, the position in the pixel circuit of the channel 155 in the pixel 240A is defined as reference position. The number of ELA cycles and the TFT-to-TFT distance in FIG. 13 are the values from the pixel of the entry to the next pixel in the scanning direction. The relative position of the channel 155 in the pixel 240B is different from the reference position by 11.5 μm in the scanning direction 51. Note that FIG. 14 does not depict an actual pixel array composed of pixels disposed side by side but depicts a state where individual pixels disposed one above the other in the pixel array illustrated in FIG. 12 are disposed side by side.

Figure 15:
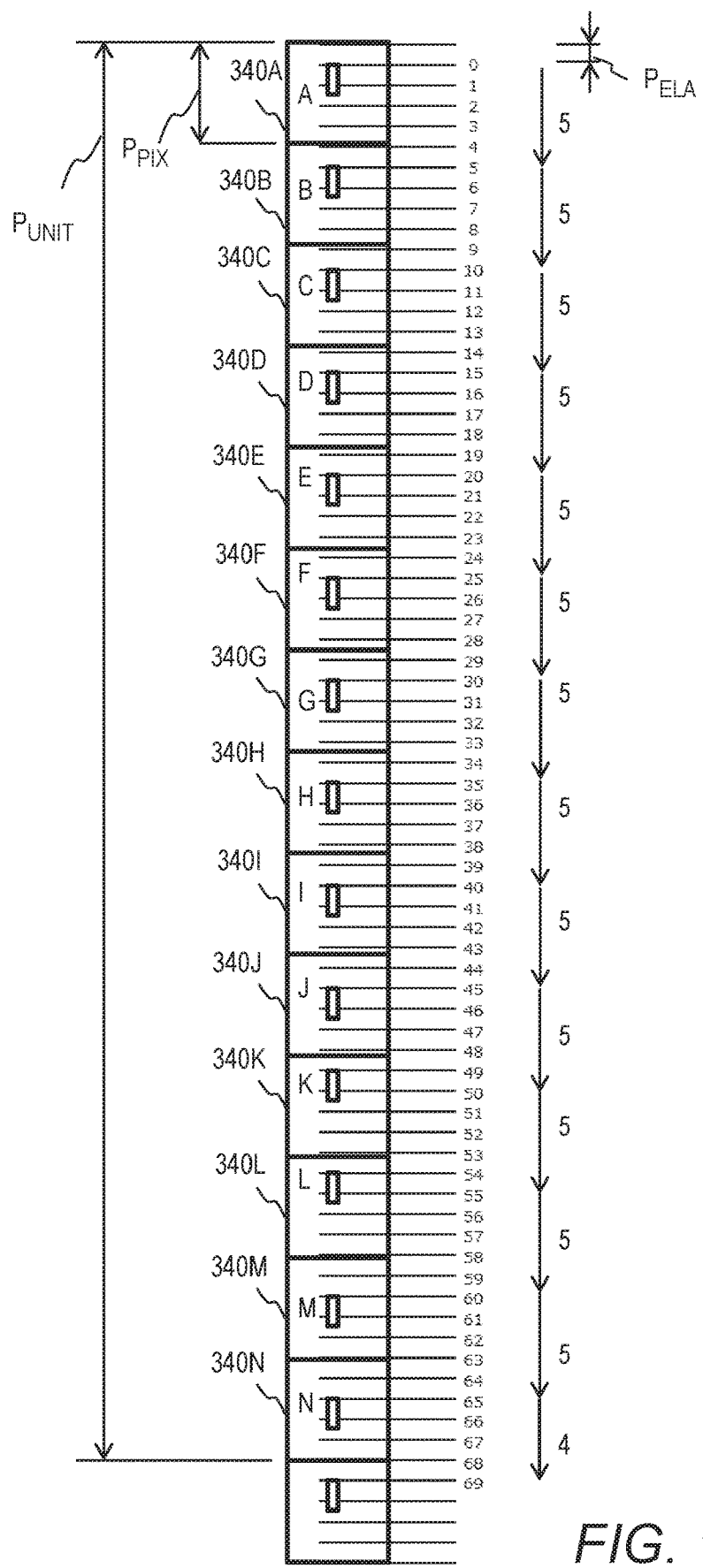
FIG. 15 provides a layout in the conditions where the pixel pitch $P_{PIX}$ is 103.5 µm, the scanning pitch $P_{ELA}$ is 21 µm, the number of pixels per pixel unit n is 14, and the number of ELA cycles is 69.

FIG. 15 provides a layout in the conditions where the pixel pitch $P_{PIX}$ is 103.5 μm, the scanning pitch $P_{ELA}$ is 21 μm, the number of pixels per pixel unit n is 14, and the number of ELA cycles N is 69. FIG. 16 provides numerical values for specifying this layout.

A pixel unit consists of fourteen pixels 340A to 340N. The distances (TFT-to-TFT distance) between the channels 155 of the driving transistors T1 of pixels adjacent to each other are four times of the scanning pitch $P_{ELA}$ only between the pixel 340N and the pixel 340A of the next pixel unit and five times of the scanning pitch $P_{ELA}$ between the other pixels.

Figure 17:
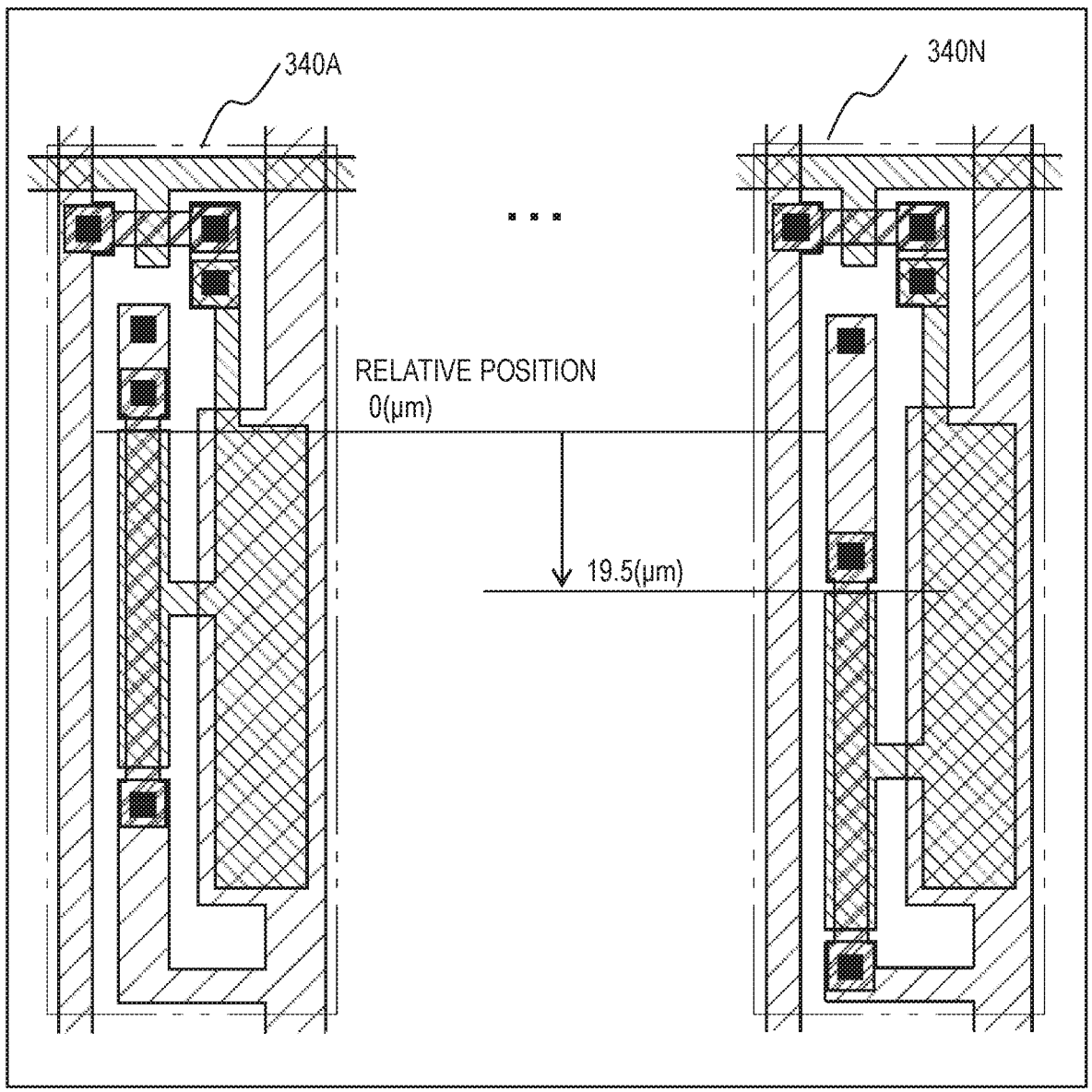
FIG. 17 illustrates the positions in pixel circuits of the channels in the layout provided in FIG. 15.

The accumulated distance in FIG. 16 indicates the total sum of the pixel pitches $P_{PIX}$ from the pixel 340A to the pixel of the entry. The relative position in FIG. 16 indicates the relative position of the channel 155 (the driving transistor T1) in the pixel circuit for the pixel of the entry. As illustrated in FIG. 17, the position in the pixel circuit of the channel 155 in the pixel 340A is defined as reference position. The relative positions of the channels 155 in the pixels 340B to 340N are provided in FIG. 16. FIG. 17 shows the relative positions of the channels 155 in the pixels 340A and 340N selected from the pixels 340A to 340N. The number of ELA cycles and the TFT-to-TFT distance in FIG. 16 are the values from the pixel of the entry to the next pixel in the scanning direction.

Positioning the driving transistors T1 within the pixel circuits as described above leads the channels 155 in different pixel circuits to be located at the same phase with respect to irradiation lines. Each channel-to-channel distance between pixels adjacent to each other is an integral multiple of the scanning pitch $P_{ELA}$ and in the foregoing description, the largest difference among the channel-to-channel distances is one scanning pitch $P_{ELA}$. Such a small difference in channel-to-channel distance facilitates designing a pixel circuit structure.

It should be noted the functions and effects of this invention are attained as far as each channel-to-channel distance between adjacent pixels is an integral multiple of the scanning pitch $P_{ELA}$. Even when the largest difference among the channel-to-channel distances is larger than one scanning pitch $P_{ELA}$, the same effects can be attained if designing a pixel circuit structure is available.

The foregoing description is based on FIGS. 10, 13, and 16 in which the pixels are listed in such a manner that the relative positions take a value of 0 or a positive value. If the pixel to be the reference is changed in the same pixel disposition, one or more relative positions will take a negative value. However, note that the pixel disposition is unchanged.

When channels are located at the same phase in ELA irradiation cycles, the channels can have the same characteristics, independently from the shape of the channels. In actual manufacture, however, channels could be slightly dislocated from the designed positions. As far as the channels are straight and their sizes in the scanning direction are an integral multiple of the scanning pitch, the characteristics differences among the channels can be made small even if the channels are slightly dislocated from the designed positions.

In the above-described examples, each pixel circuit is disposed within the area of the subpixel to be driven by the pixel circuit when seen from the top. However, the area occupied by a pixel circuit does not need to be included in the area of the light-emitting region of the associated subpixel when seen from the top. Especially, top emission type of display devices have high flexibility in layout of pixel circuits and the light-emitting regions of subpixels; the area of a pixel circuit of a pixel may overlap partially or wholly with the area of the light-emitting region of an adjacent subpixel. The area including the light-emitting region of a subpixel may include the pixel circuit of another subpixel. Subpixels of different colors can have pixel circuits having different element layouts. Subpixels of the same color can have pixel circuits having different element layouts. For example, a display device may have pixel circuits structured to be symmetric about a virtual axis.

The channels of the driving TFTs of all pixels in the display region 125 do not need to be located at the same phase in ELA irradiation cycles. For example, the channels of the driving TFTs of pixels of different colors can be located at different phases in ELA irradiation cycles as far as the channels of the driving TFTs of pixels of the same color are located at the same phase in ELA irradiation cycles.

The above-described layout of the channels of driving TFTs is applicable to transistors other than the driving TFTs or transistors in a display device of a type other than the OLED display device. In addition, this layout is applicable to transistors in a device including TFTs arrayed in a matrix. Furthermore, this layout is applicable to transistors of a kind other than poly-silicon transistors that are to be annealed with a pulse laser beam. Such transistors include oxide semiconductor transistors to be annealed with a pulse laser beam.

Embodiment 2

Bending Channels

Hereinafter, driving TFTs having bending channels are described. Differences from Embodiment 1 are mainly described in the following. The description provided in Embodiment 1 is applicable to Embodiment 2, except for the description about the shapes and the positions of the channels.

Figure 18:
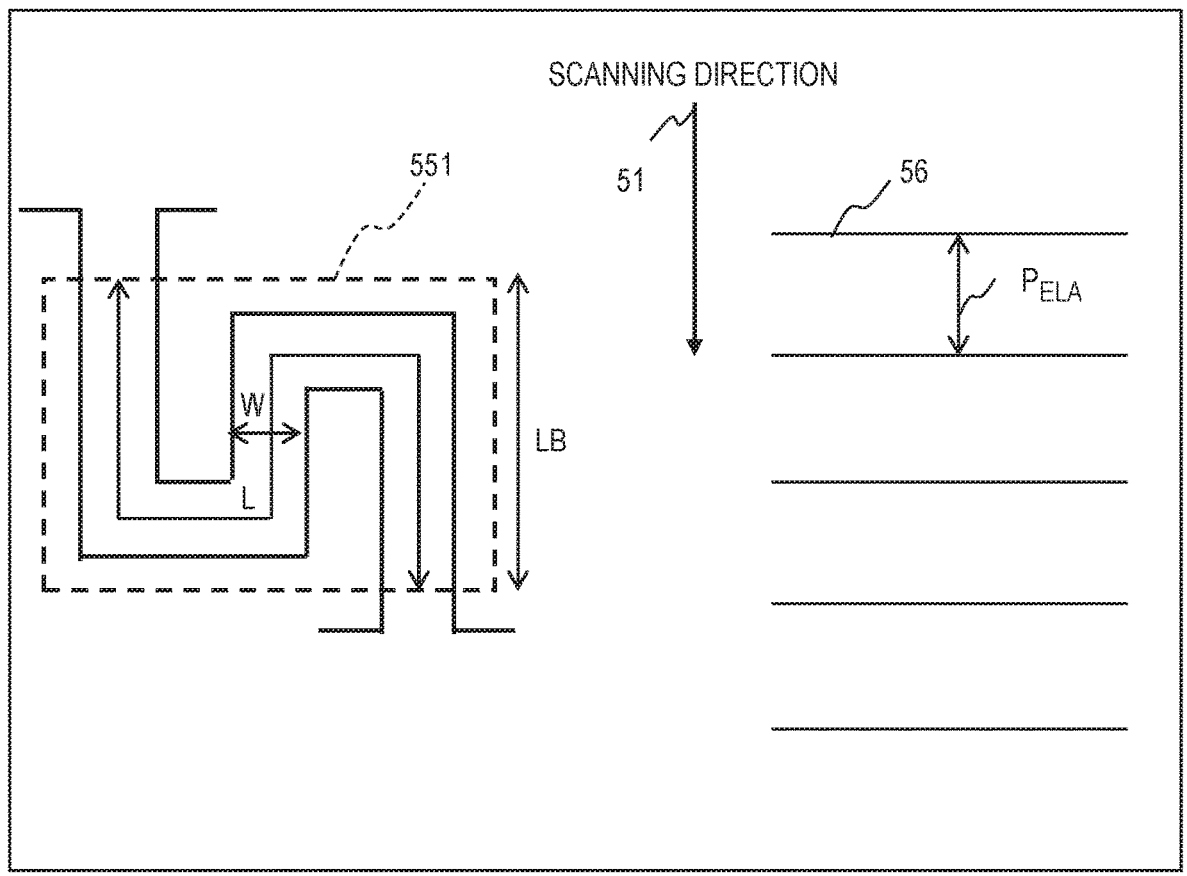
FIG. 18 schematically illustrates an example of the positional relation of a bending channel to irradiation lines of a pulse laser beam.

The trend of display devices for higher resolution has encouraged employment of bending channels so as to dispose driving TFTs having a long channel length L within a small area. FIG. 18 schematically illustrates an example of the positional relation of a bending channel 551 to irradiation lines 56 of a pulse laser beam. For convenience of referencing, the rectangle in dashed lines surrounding a channel is denoted by a reference sign 551. This way of referencing the channel is used in the subsequent drawings.

The bending channel 551 is formed in such a manner that first sections extending in the scanning direction 51 and second sections extending in the direction perpendicular to the scanning direction 51 are alternately connected. The channel 551 has a channel length L and a channel width W.

As will be described later, in the case where channels are bending and located at different phases in irradiation cycles, the proportion of the channel regions having different characteristics can be different among the channels, even if the channel size LB in the scanning direction 51 is an integral multiple of the scanning pitch $P_{ELA}$. For this reason, the individual driving TFTs could show different characteristics.

Figure 19:
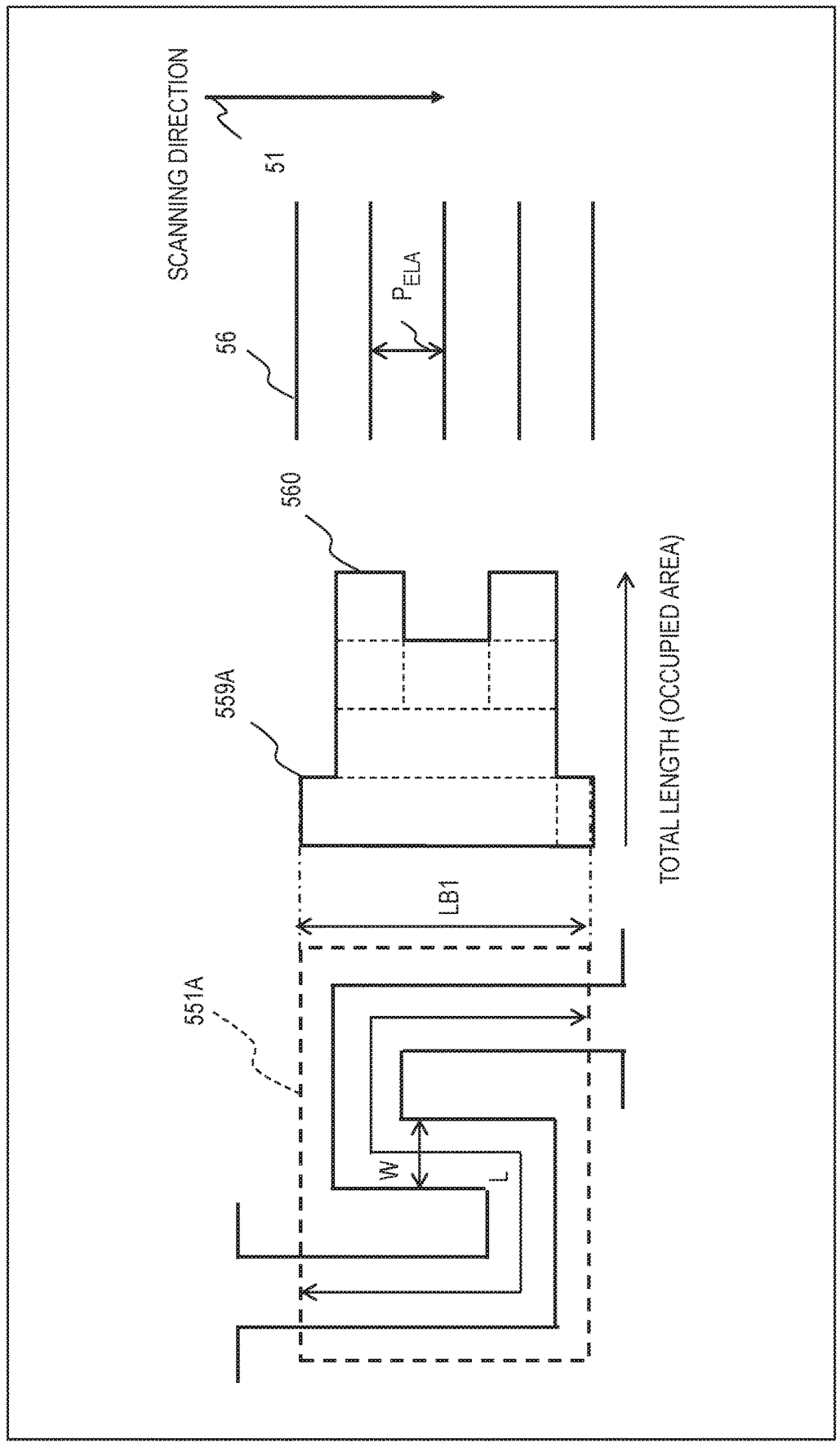
FIG. 19 illustrates a bending channel and a distribution of areas occupied by the channel at each position in the scanning direction.

Hereinafter, some examples of the shape of a bending channel are described. FIG. 19 illustrates a bending channel 551A and a distribution 559A of areas occupied by the channel 551A at each position in the scanning direction 51. The channel 551A has a channel length L, a channel width W, and a channel size LB1 in the scanning direction 51.

The distribution 559A provides the sum of the lengths in the direction perpendicular to the scanning direction 51 of the channel 551A (the area occupied by the channel 551A) at each position in the scanning direction 51. In other words, defining virtual lines extending perpendicularly to the scanning direction 51 at different positions in the scanning direction 51, the distribution 559A provides the sum of the lengths of the overlap segments of each virtual line with the channel 551A.

As noted from the shape of the distribution 559A, the channel 551A in FIG. 19 has large differences in total length (or area) among the positions in the scanning direction 51. The distribution 559A in FIG. 19 has two peaks 560 at positions including irradiation points (lines) 56. Another channel located at a different phase of an ELA irradiation cycle has these peaks 560 at different positions. That is to say, the proportions of the regions having different characteristics are significantly different among the channels of different subpixels. As described above, when different channels are located at the same phase in ELA irradiation cycles, they show the same channel characteristics. When those channels are located at different phases, however, their channel characteristics could be significantly different.

Figure 20:
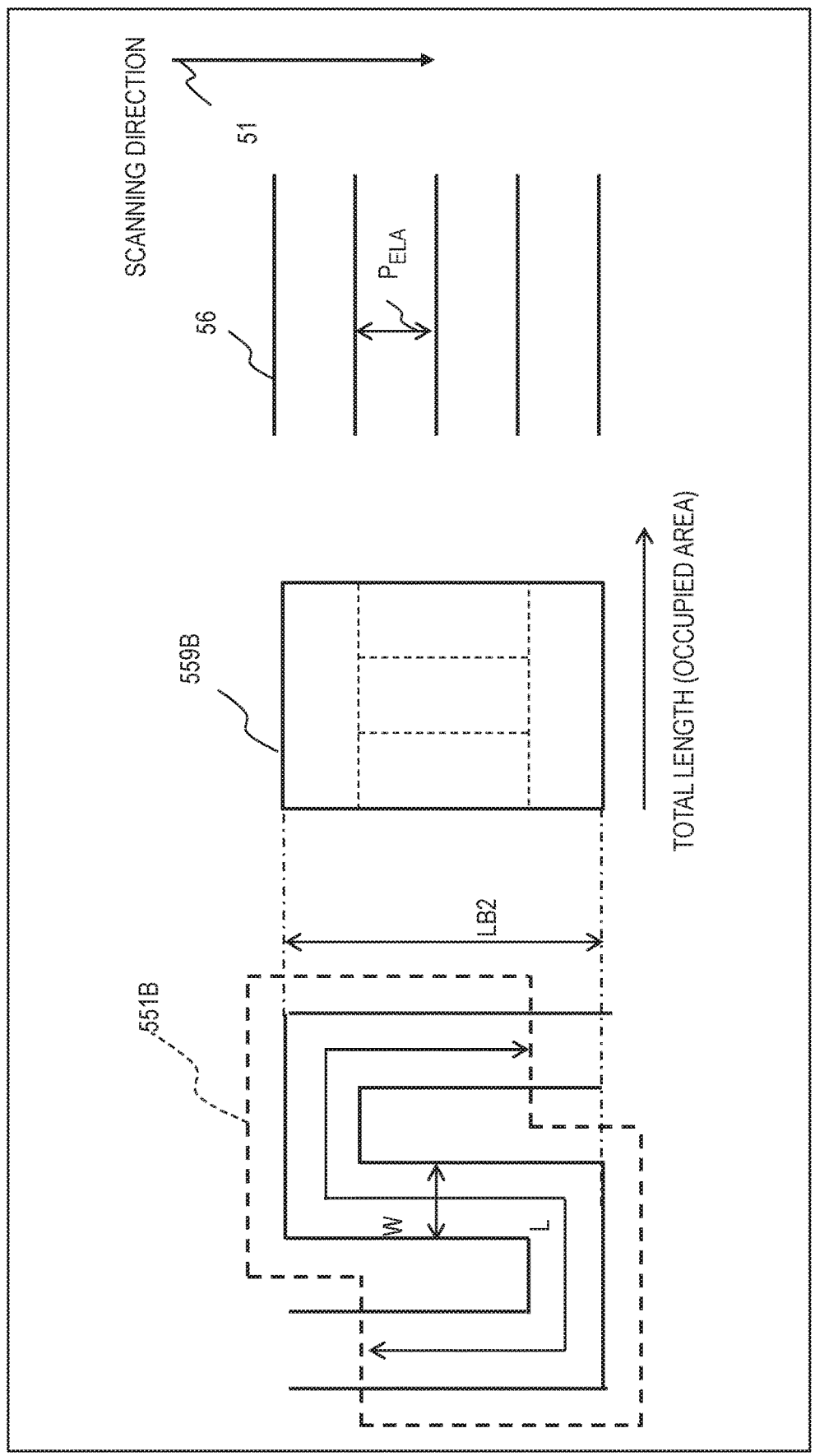
FIG. 20 illustrates another bending channel and a distribution of areas occupied by the channel at each position in the scanning direction.

FIG. 20 illustrates another bending channel 551B and a distribution 559B of areas occupied by the channel 551B at each position in the scanning direction 51. The channel 551B has a channel length L, a channel width W, and a channel size LB2 in the scanning direction 51.

As indicated in the distribution 559B, the channel 551B has a uniform total length (or area) at each position in the scanning direction 51. In other words, the total length at every position in the scanning direction 51 is the same value. Accordingly, if the channel size LB is an integral multiple of the scanning pitch $P_{ELA}$, the differences in proportion of the channel regions having different characteristics among TFTs become small or substantially eliminated.

The foregoing description about FIG. 20 is provided assuming that the characteristics of the transistors having a bending channel are the synthetic characteristics of the channel portions at individual phases, independently from the direction of the electric current. The reason why such a description is viable will be described later.

Figure 21:
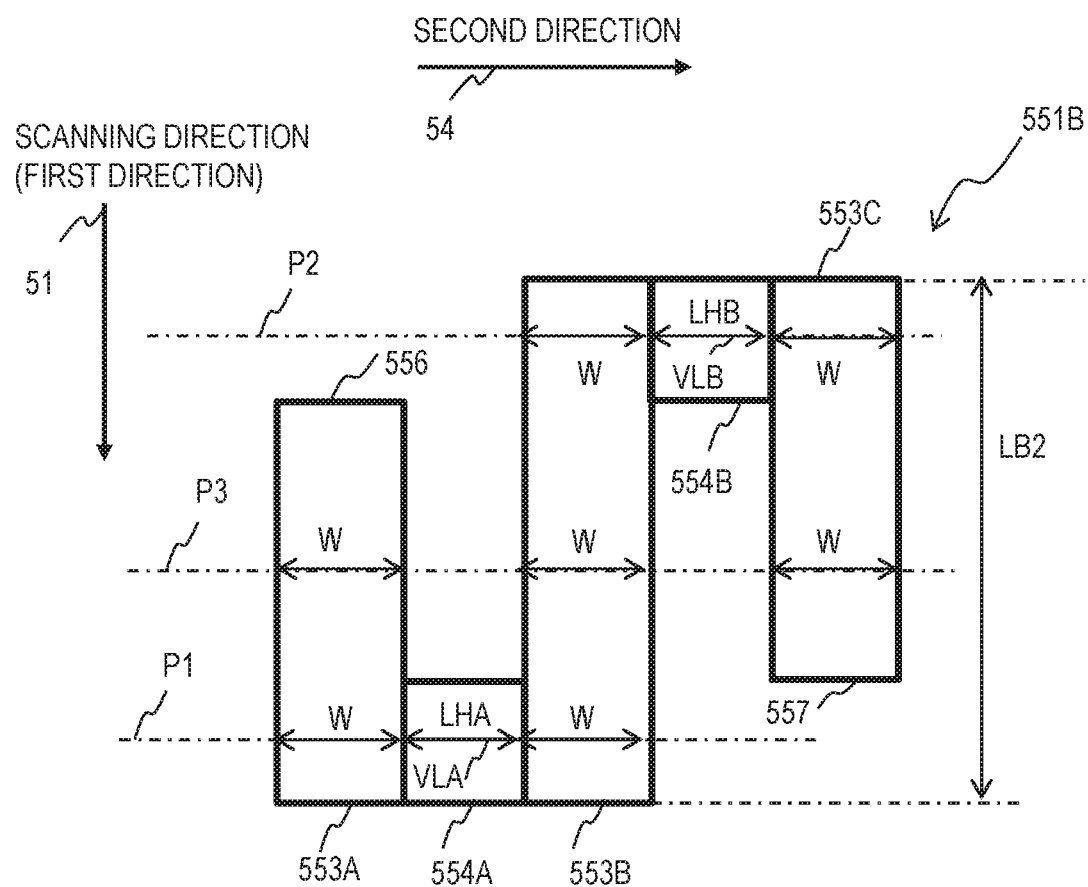
FIG. 21 is a diagram for illustrating the details of the shape of the channel illustrated in FIG. 20.

FIG. 21 is a diagram for illustrating the details of the shape of the channel 551B in FIG. 20. The channel 551B has a shape such that a plurality of rectangles are combined; its straight parts along the electric current path have a uniform channel width W. The channel length L (see FIG. 20) is defined along the central line of the electric current path between the channel ends 556 and 557. The channel 551B consists of sections 553A, 553B, and 553C extending in the first direction and sections 554A and 554B extending in the second direction. The first direction is parallel to the scanning direction 51 and the second direction is perpendicular to the scanning direction 51.

In FIG. 21, the scanning direction 51 is directed from the top to the bottom of the drawing. In the subsequent FIGS. 21 to 24, the first direction is denoted by 51, which is the same as the reference sign of the scanning direction. The second direction is directed from the right to the left or from the left to the right of the drawing. In the following description, the second direction is defined as the direction 54 directed from the left to the right of the drawing.

In the channel 551B, the sections extending in the first direction and the sections extending in the second direction are connected alternately. Specifically, the section 553A extending in the first direction, the section 554A extending in the second direction, the section 553B extending in the first direction, the section 554B extending in the second direction, and the section 553C extending in the first direction are connected in this order.

Regarding each section extending in the second direction, at least one end thereof is connected with a side extending along the first direction of an end part in the first direction of a section extending in the first direction. Specifically, the section 554A extending in the second direction is connected with the sections 553A and 553B extending in the first direction at both ends.

The left end of the section 554A is connected with the lower end part of the section 553A, particularly the right side in FIG. 21 or a side extending along the first direction 51 of the lower end part of the section 553A. The right end of the section 554A is connected with the lower end part of the section 553B, particularly the left side in FIG. 21 or a side extending along the first direction 51 of the lower end part of the section 553B.

The section 554B extending in the second direction is connected with the sections 553B and 553C extending in the first direction at both ends. The left end of the section 554B is connected with the upper end part of the section 553B, particularly the right side of the upper end part of the section 553B. The right end of the section 554B is connected with the upper end part of the section 553C, particularly the left side of the upper end part of the section 553C.

In each of the sections 554A and 554B extending in the second direction, a virtual middle line extending straight in the second direction 54 from one end to the other end can be defined. The position P1 in the first direction 51 corresponds to the position of the virtual line VLA of the section 554A. The virtual line VLA of the section 554A has a length LHA. The position P2 in the first direction 51 corresponds to the position of the virtual line VLB of the section 554B extending in the second direction. The virtual line VLB of the section 554B has a length LHB.

At each position in the first direction of the virtual line of a section extending in the second direction, the sum TL of the length LH* of the virtual line and the product of the number of sections extending in the first direction that exist along the second direction and the channel width W is the same value. The asterisk (*) in LH* is a so-called wildcard representing a null or a character string consisting of one or more characters.

The product of the number of sections extending in the first direction that exist along the second direction and the channel width at the position in the first direction of the virtual line of a section extending in the second direction corresponds to the total sum of the channel widths of the sections extending in the first direction at the position. The channel width means the dimension in the second direction of the channel and equals to the width (dimension in the direction perpendicular to the first direction) of the so-called channel as the electric current path of the TFT. It is preferable that the width of the so-called channel as the electric current path of the TFT be uniform throughout the sections extending in the first direction and the sections extending in the second direction. Specifically, at the position P1 of the virtual line VLA of the section 554A, there exist two sections 553A and 553B extending in the first direction. The length of the virtual line VLA is LHA. Accordingly, the total length TL is 2W+LHA.

At the position P2 of the virtual line VLB of the section 554B, there exist two sections 553B and 553C extending in the first direction. The length of the virtual line VLB is LHB. Accordingly, the total length TL is 2W+LHB. The length LHA is equal to the length LHB. That is to say, the total lengths TL at the positions P1 and P2 are the same value.

At any positions in the first direction where a virtual line extending straight in the second direction does not cross any section extending in the second direction, the products of the number of sections extending in the first direction that is crossed by the virtual line and the channel width W are the same value. For example, at a position P3 in the first direction 51, there is no section extending in the second direction but exist sections 553A, 553B, and 553C extending in the first direction. Accordingly, the product of the number of sections extending in the first direction and the channel width W is 3W. In the example of FIG. 21, the values of LHA, LHB, and W are the same. That is to say, the total lengths TL at positions P1, P2, and P3 are all the same 3W.

The channel ends 556 and 557 defining the channel length L are located inner than the upper end and the lower end of the channel 551B defining the channel size LB2 in the first direction. More specifically, the position in the first direction 51 of the channel end 556 is the same as the position of the lower end of the section 554B. Further, the position in the first direction 51 of the channel end 557 is the same as the position of the upper end of the section 554A. The lengths in the first direction of the sections 553A and 553C are equal. The length in the first direction of the section 553B is longer than the length of the sections 553A and 553C extending by the channel width W.

Figure 22:
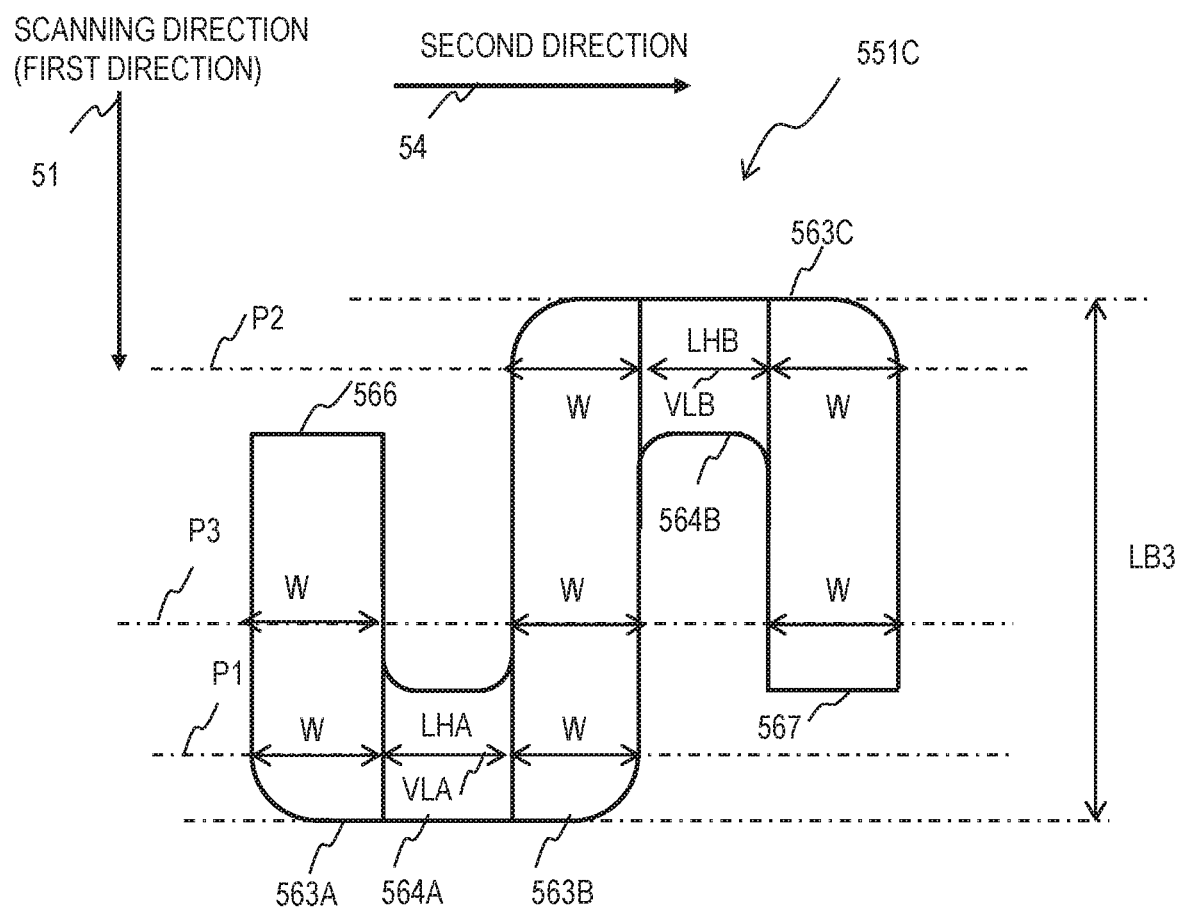
FIG. 22 illustrates another example of the shape of a channel.

FIG. 22 illustrates another example of the shape of a channel. A channel 551C has a uniform channel width W in its straight parts along the electric current path. The channel length L is defined along the central part of the electric current path between the channel ends 566 and 567. The central part of the electric current path includes the center of the electric current path and a predetermined width from the center. The channel 551C consists of sections 563A, 563B, and 563C extending in the first direction 51 and sections 564A and 564B extending in the second direction 54. The first direction 51 is parallel to the scanning direction 51 and the second direction is perpendicular to the scanning direction 51.

All corners of the channel 551B described with reference to FIG. 21 are right angles. In contrast, some corners of the channel 551C have a curve (R) when seen from the top. Specifically, the channel 551C has curved corners on the lower left of the section 563A extending in the first direction, the lower right and the upper left of the section 563B extending in the first direction, and the upper right of the section 563C extending in the first direction. These corners are outer curved corners. The channel 551C further has curved corners on the upper left and upper right of the section 564A extending in the second direction and the lower left and lower right of the section 564B extending in the second direction. These corners are inner curved corners.

Because of these corners, the total length (or the area) in the channel 551C is not perfectly uniform at each position in the scanning direction 51. However, the configuration described in the following reduces the differences in proportion of the regions having different characteristics throughout the channel, so that the total length (or the area) can be regarded as substantially uniform at each position in the scanning direction 51.

In the channel 551C, the section 563A extending in the first direction, the section 564A extending in the second direction, the section 563B extending in the first direction, the section 564B extending in the second direction, and the section 563C extending in the first direction are connected in this order.

The section 564A extending in the second direction is connected with the sections 563A and 563B extending in the first direction at both ends. The left end of the section 564A is connected with the lower end part of the section 563A, particularly the right side or a side extending along the first direction 51 of the lower end part of the section 563A. The right end of the section 564A is connected with the lower end part of the section 563B, particularly the left side or a side extending along the first direction 51 of the lower end part of the section 563B.

The section 564B extending in the second direction is connected with the sections 563B and 563C extending in the first direction at both ends. The left end of the section 564B is connected with the upper end part of the section 563B, particularly the right side of the upper end part of the section 563B. The right end of the section 564B is connected with the upper end part of the section 563C, particularly the left side of the upper end part of the section 563C.

In each of the sections 564A and 564B extending in the second direction, a virtual middle line extending straight in the second direction 54 from one end to the other end can be defined. The position P1 in the first direction 51 corresponds to the position of the virtual line VLA of the section 564A. The virtual line VLA of the section 564A has a length LHA. The position P2 in the first direction 51 corresponds to the position of the virtual line VLB of the section 564B. The virtual line VLB of the section 564B has a length LHB.

At the position P1 of the virtual line VLA of the section 564A, there exist two sections 563A and 563B extending in the first direction. The length of the virtual line VLA is LHA. Accordingly, the total length TL is 2W+LHA. At the position P2 of the virtual line VLB of the section 564B, there exist two sections 563B and 563C extending in the first direction. The length of the virtual line VLB is LHB. Accordingly, the total length TL is 2W+LHB. The length LHA is equal to the length LHB. That is to say, the total lengths TL at the positions P1 and P2 are the same value.

At a position P3 in the first direction 51, there is no section extending in the second direction but exist sections 563A, 563B, and 563C extending in the first direction. Accordingly, the product of the number of sections extending in the first direction and the channel width W is 3W. The values of LHA, LHB, and W are the same. That is to say, the total lengths TL at the positions P1, P2, and P3 are all the same 3W. At the other positions in the first direction where a virtual line extending straight in the second direction does not cross any section extending in the second direction, the products of the number of sections extending in the first direction that is crossed by the virtual line and the channel width are 3W.

The channel ends 566 and 567 defining the channel length L are located inner than the upper end and the lower end of the channel 551C defining the channel size LB3 in the first direction. More specifically, the position in the first direction 51 of the channel end 566 is the same as the position of the lower end of the straight part of the section 564B. The lower end of the straight part of the section 564B is located at the position defining the channel width W of the section 564B.

Further, the position in the first direction 51 of the channel end 567 is the same as the position of the upper end of the straight part of the section 564A. The upper end of the section 564A is located at the position defining the channel width W of the section 564A. The lengths in the first direction of the sections 563A and 563C are equal. The length in the first direction of the section 563B is longer than the length in the first direction of the sections 563A or 563C by the channel width W.

Figure 23:
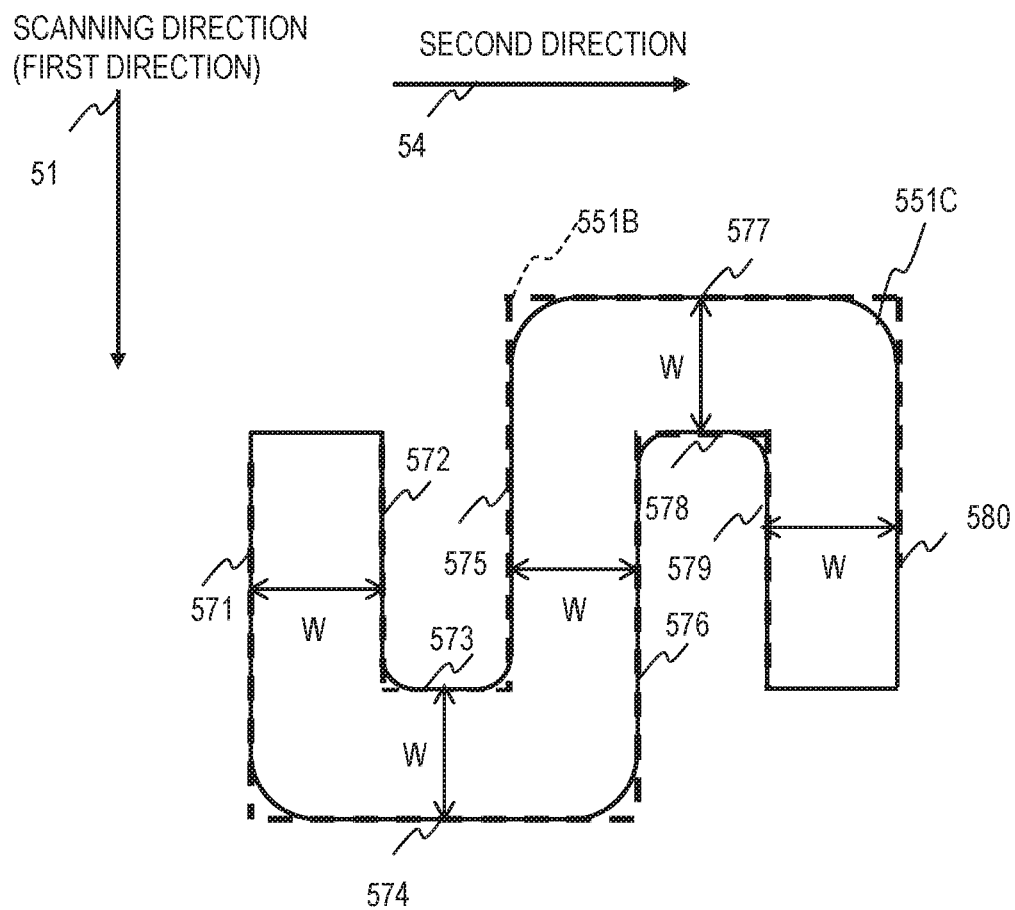
FIG. 23 illustrates a relation between a channel having R corners and a channel having square corners.

FIG. 23 illustrates the relation between the channel 551C having curved (R) corners when seen from the top and the channel 551B whose corners are all right angles. In FIG. 23, the channel 551C is indicated by a solid line and the channel 551B is indicated by a dashed line and they are superposed one above the other. In FIG. 23, the channel width W and the channel length L are common to the channels.

As understood from FIG. 23, the shape obtained by virtual end faces (sides) continued straight from the end faces (sides) defining the channel width W of the channel 551C is identical to the shape of the channel 551B. Specifically, the end faces 571 and 572 extending in the first direction 51 are extended downward. The end faces 573, 574, 577, and 578 extending in the second direction 54 are extended both leftward and rightward. The end faces 575 and 576 extending in the first direction 51 are extended both upward and downward. The end faces 579 and 580 extending in the first direction are extended upward.

The shape surrounded by the virtual end faces formed as described above is identical to the channel shape of the channel 551B. That is to say, regarding this virtual shape, the total length (or the area) is perfectly uniform at each position in the scanning direction (first direction) 51. In other words, the areas of the parts of this virtual shape sectioned in the scanning direction (first direction) 51 are perfectly uniform. The channel 551C having such a shape can effectively reduce the differences in proportion of the regions having different characteristics throughout the channel.

Figure 24:
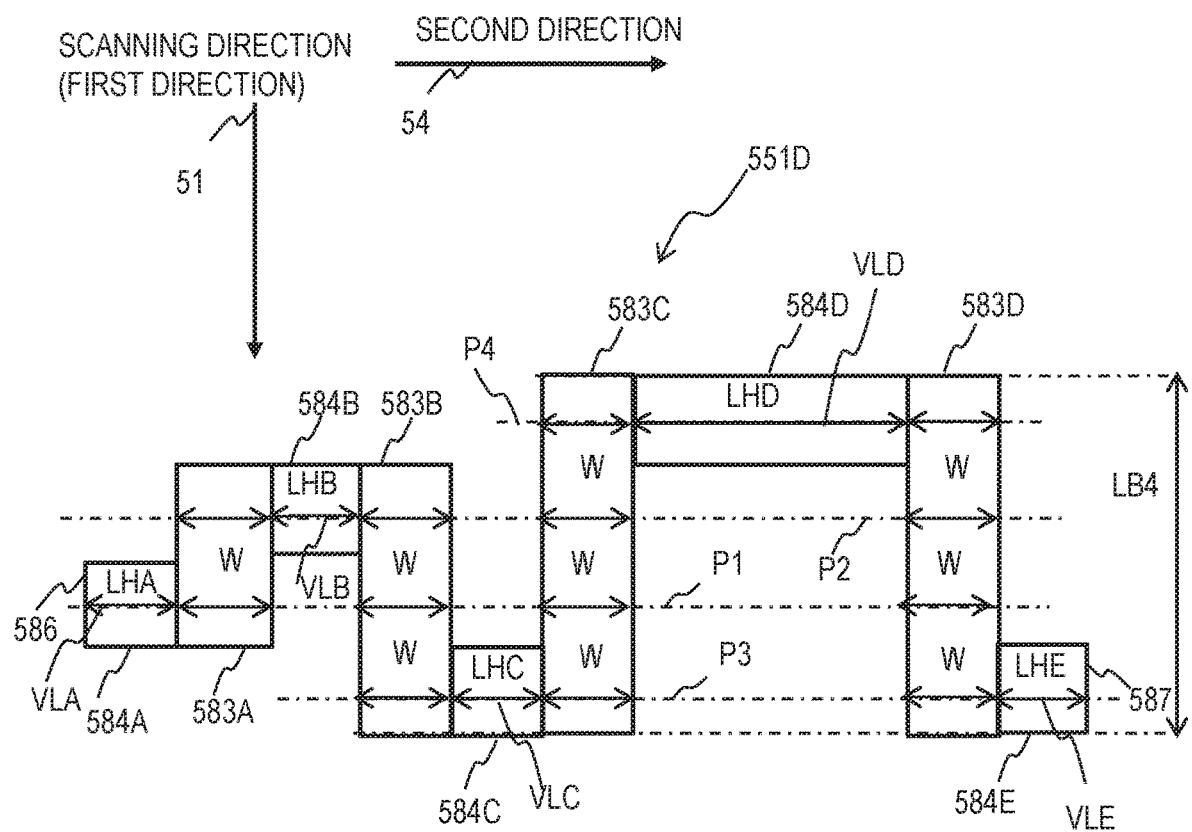
FIG. 24 illustrates still another example of the shape of a channel.

FIG. 24 illustrates still another example of the shape of a channel. A channel 551D includes more sections extending in the first direction and more sections extending in the second direction than the above-described channels 551B or 551C. In the channel 551D, all corners are right angles like those in the channel 551B and the total length (area) is perfectly uniform at each position in the scanning direction (first direction) 51.

The channel 551D has a uniform channel width W. The channel length L is defined between the channel ends 586 and 587. The channel 551D consists of sections 583A to 583D extending in the first direction 51 and sections 584A to 584E extending in the second direction 54. The first direction 51 is parallel to the scanning direction 51 and the second direction 54 is perpendicular to the scanning direction 51.

In the channel 551D, the section 584A extending in the second direction, the section 583A extending in the first direction, the section 584B extending in the second direction, the section 583B extending in the first direction, the section 584C extending in the second direction, the section 583C extending in the first direction, the section 584D extending in the second direction, the section 583D extending in the first direction, and the section 584E extending in the second direction are connected in this order.

The section 584A extending in the second direction is connected with a section extending in the first direction only at one end. Specifically, the right end of the section 584A is connected with the lower end part of the section 583A, particularly the left side or a side extending along the first direction 51 of the lower end part of the section 583A.

The section 584B extending in the second direction is connected with the sections 583A and 583B extending in the first direction at both ends. The left end of the section 584B is connected with the upper end part of the section 583A, particularly the right side of the upper end part of the section 583A. The right end of the section 584B is connected with the upper end part of the section 583B, particularly the left side of the upper end part of the section 583B.

The section 584C extending in the second direction is connected with the sections 583B and 583C extending in the first direction at both ends. The left end of the section 584C is connected with the lower end part of the section 583B, particularly the right side of the lower end part of the section 583B. The right end of the section 584C is connected with the lower end part of the section 583C, particularly the left side of the lower end part of the section 583C.

The section 584D extending in the second direction is connected with the sections 583C and 583D extending in the first direction at both ends. The left end of the section 584D is connected with the upper end part of the section 583C, particularly the right side of the upper end part of the section 583C. The right end of the section 584D is connected with the upper end part of the section 583D, particularly the left side of the upper end part of the section 583D.

The section 584E extending in the second direction is connected with a section extending in the first direction only at one end. Specifically, the left end of the section 584E is connected with the lower end part of the section 583D, particularly the right side or a side extending along the first direction 51 of the lower end part of the section 583D.

In each of the sections 584A to 554E extending in the second direction, a virtual middle line extending straight in the second direction 54 from one end to the other end can be defined. The position P1 in the first direction 51 corresponds to the position of the virtual line VLA of the section 584A. The virtual line VLA of the section 584A has a length LHA.

The position P2 in the first direction 51 corresponds to the position of the virtual line VLB of the section 584B. The virtual line VLB of the section 584B has a length LHB. The position P3 in the first direction 51 corresponds to the position of the virtual line VLC of the section 584C. The virtual line VLC of the section 584C has a length LHC. The position P4 in the first direction 51 corresponds to the position of the virtual line VLD of the section 584D. The virtual line VLD of the section 584D has a length LHD. The position of the virtual line VLE of the section 584E is the same position P3 as the virtual line VLC. The virtual line VLE of the section 584E has a length LHE.

At the position P1 of the virtual line VLA of the section 584A, there exist four sections 583A to 583D extending in the first direction. The length of the virtual line VLA is LHA. Accordingly, the total length TL is 4W+LHA. At the position P2 of the virtual line VLB of the section 584B, there exist four sections 583A to 583D extending in the first direction. The length of the virtual line VLB is LHB. Accordingly, the total length TL is 4W+LHB.

At the position P3, there exist two sections 584C and 584E extending in the second direction and three sections 583B, 583C, and 583D extending in the first direction. The lengths of the virtual lines VLC and VLE are LHC and LHE, respectively. Accordingly, the total length TL is 3W+LHC+LHE. At the position P4 of the virtual line VLD of the section 584D, there exist two sections 583C and 583D extending in the first direction. The length of the virtual line VLD is LHD. Accordingly, the total length TL is 2W+LHD.

In the channel 551D in FIG. 24, the lengths LHA, LHB, LHC, and LHE are equal to the channel width W. The length LHD is three times of the channel W. Accordingly, the total lengths TL at all positions P1 to P4 are the same 5W. Meanwhile, a virtual line extending in the second direction at any position in the first direction 51 overlaps at least one section extending in the second direction in the channel 551D. In other words, when the channel 551D is seen in the second direction 54, there is at least one section extending in the second direction at any position in the first direction 51.

Returning to FIG. 20, the channel size LB2 of the channel 551B in the scanning direction 51 is an integral multiple of the scanning pitch $P_{ELA}$ of the pulse laser beam 50. This configuration enables the channel 551B to exhibit the same channel characteristics when the channel 551B is located at any phase of an irradiation cycle in the scanning direction.

As described above, the channel 551B has a uniform total length TL at each position in the scanning direction 51. Accordingly, when the channel size LB2 in the scanning direction 51 of the channel 551B is an integral multiple of the scanning pitch $P_{ELA}$, the channel 551B has the same size of area at every phase. For this reason, the proportions of the regions having different characteristics are the same among a plurality of channels 551B. Accordingly, when the channel size LB2 is an integral multiple of the scanning pitch $P_{ELA}$, uniform channel characteristics can be maintained, regardless of the position of the channel 551B.

The same applies to the bending channel 551D described with reference to FIG. 24. As to the channel 551C described with reference to FIG. 22, the total length (area) at each position in the scanning direction 51 is not perfectly uniform since the channel 551C have curved (R) corners when viewed from the top, as described above. However, the channel 551D configured as described above can show the uniform channel characteristics independently from the position where the channel 551D is located, if the channel size LB4 of the channel 551D is an integral multiple of the scanning pitch $P_{ELA}$.

In another configuration example, channels 551B, 551C, or 551D having the above-described bending shape are configured to have a channel size LB of an integral multiple of the scanning pitch $P_{ELA}$ and disposed at the same phase in ELA irradiation cycles. As a result, the characteristics become more uniform among the channels.

In still another configuration example, channels 551B, 551C, or 551D having the above-described bending shape are configured to have a channel size LB different from an integral multiple of the scanning pitch $P_{ELA}$ and disposed at the same phase in ELA irradiation cycles.

In Embodiment 2, the channels of the driving TFTs for the pixels of the same color are provided at the same phase in ELA irradiation cycles. Accordingly, channels having a desirably bent shape can have uniform channel characteristics, independently from their locations. However, the actual channel locations could be fluctuated with respect to (differ from) the designed positions. When each channel has a bending shape that exhibits small differences in proportion of the regions having different characteristics throughout the channel, the differences in characteristics among a plurality of channels can be made small even if the channels are slightly dislocated from the designed positions. Such a bending channel can have a channel size different from an integral multiple of the scanning pitch $P_{ELA}$.

Now, the reason for the description about FIG. 20, why the characteristics of a transistor having a bending channel can be described as the synthetic characteristics of the individual phase-related characteristics of the channel portions, independently from the direction of the electric current, is described.

An experiment was conducted with closely-spaced test transistors each having a channel width and a channel length both of W. This W corresponds to the W described in FIG. 20. The test transistors include two types of transistors: parallel type of test transistors (hereinafter, referred to as parallel type) and perpendicular type of test transistors (hereinafter, referred to as perpendicular type). The parallel type is a transistor disposed in such a manner that the direction of the channel length or the direction of electric current is parallel to the scanning direction. On the other hand, the perpendicular type is a transistor disposed in such a manner that the direction of the channel length or the direction of electric current is perpendicular to the scanning direction.

A plurality of pairs each consisting of one parallel type and one perpendicular type were prepared and disposed on a substrate. In each pair, a parallel type and a perpendicular type are disposed closely. In the plurality of pairs, each parallel type and each perpendicular type are disposed at slightly different positions, particularly at different phases in irradiation cycles of the pulse laser beam.

The characteristics of the test transistors disposed in such a manner were measured, sorted by the phases where the transistors are located, and made comparison between the parallel type and the perpendicular type. The result of the comparison revealed that the characteristics are equal and further, the variations of the characteristics with phase are also equal. That is to say, as to a transistor having a channel width suitable for a pixel circuit, individual channel portions (or fragments) obtained by dividing the channel along the channel length into portions having a length equal to a channel width have the same (or substantially equal) characteristics no matter whether the electric current flows in parallel to or perpendicularly to the ELA scanning direction Accordingly, as described with reference to FIG. 20, the characteristics of a transistor having a bending channel can be described as the synthetic characteristics of the individual phase-related characteristics of the channel portions.

Figure 25A:
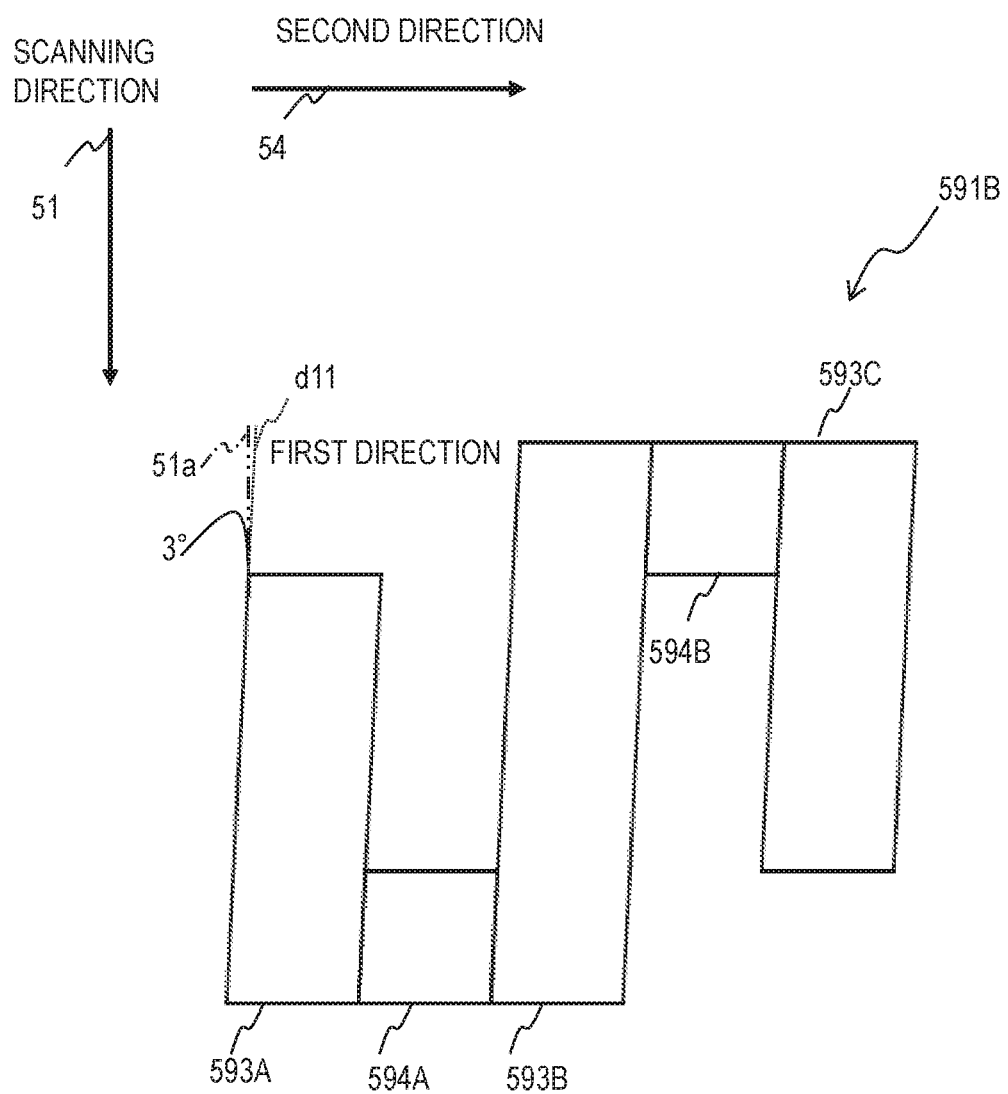
FIG. 25A illustrates an example of the shape of a channel where the angle between the first direction and the scanning direction is 3 degrees.
Figure 25B:
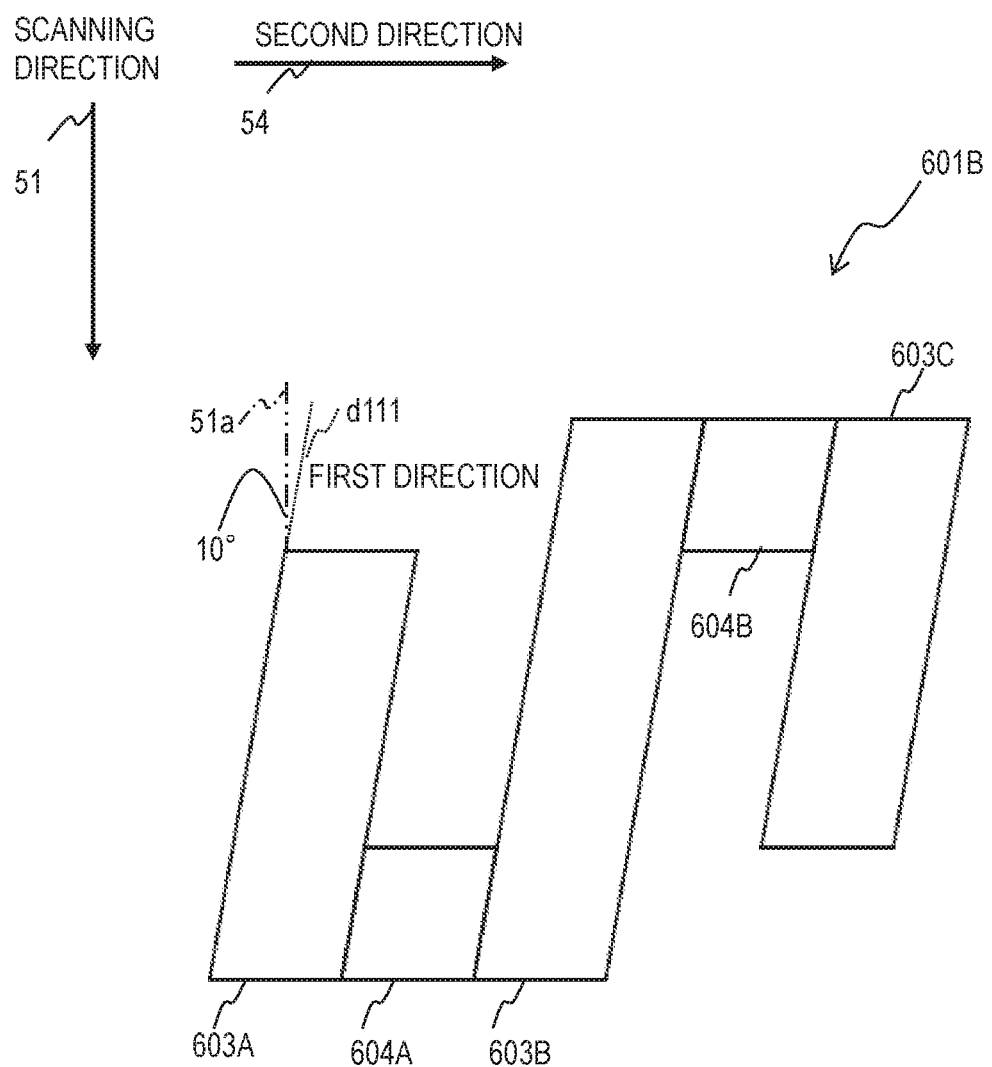
FIG. 25B illustrates an example of the shape of a channel where the angle between the first direction and the scanning direction is 10 degrees.
Figure 25C:
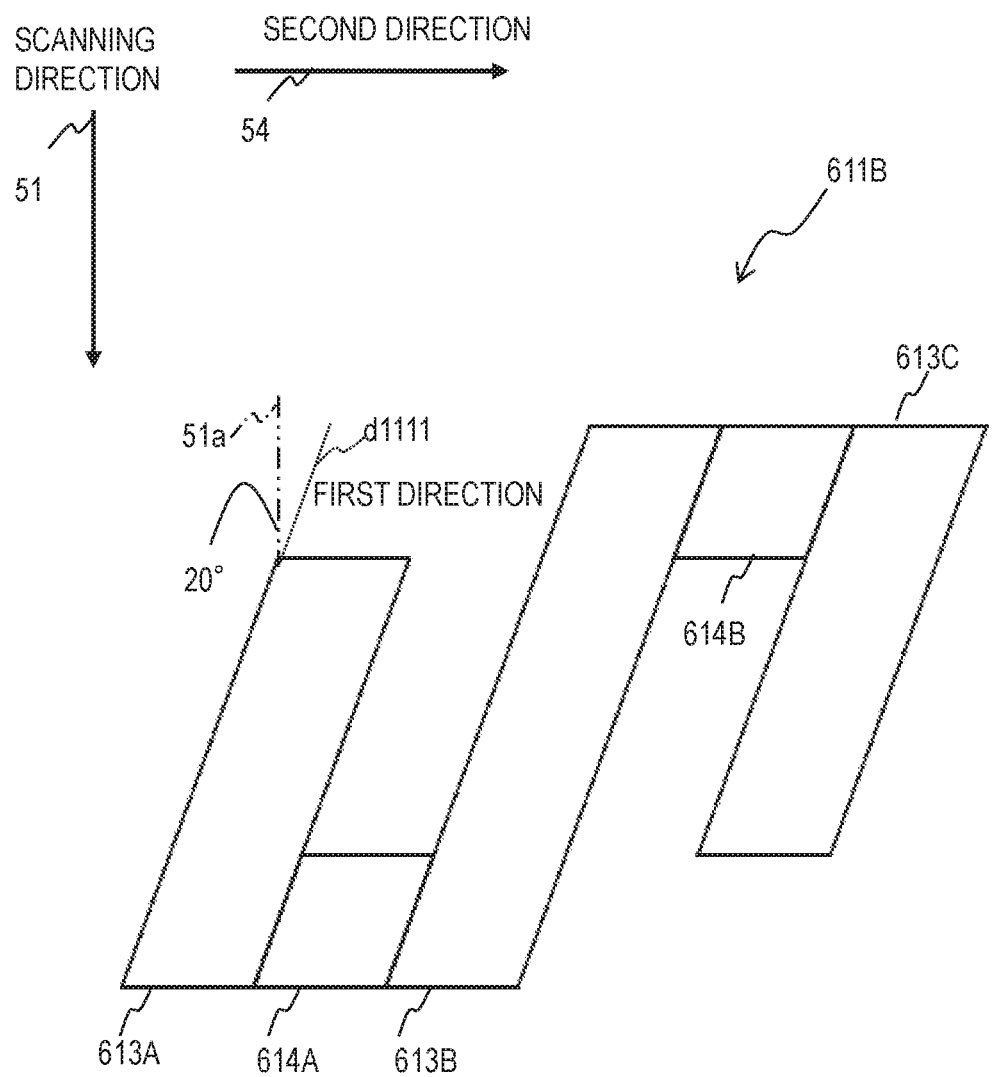
FIG. 25C illustrates an example of the shape of a channel where the angle between the first direction and the scanning direction is 20 degrees.

FIGS. 21 to 24 have provided examples where the angle between the first direction of each section extending in the first direction and the scanning direction is 0 degrees, in other words, the first direction is parallel to the scanning direction. However, the absolute value between the first direction and the scanning direction can be more than 0 degrees. FIGS. 25A to 25C illustrate examples of the channel shape where the angles between the first direction and the scanning direction are 3 degrees, 10 degrees, and 20 degrees.

In FIG. 25A, the absolute values of the angles between the first direction d11 and the scanning direction of sections 593A, 593B, and 593C extending in the first direction in a channel 591B are 3 degrees. The two-dot chain line 51a is a line parallel to the scanning direction 51. The first direction d11 is indicated by a dotted line in FIG. 25A and is along the long side of each section extending in the first direction.

In the channel 591B, the sections extending in the first direction and the sections extending in the second direction are connected alternately. Specifically, the section 593A extending in the first direction, the section 594A extending in the second direction, the section 593B extending in the first direction, the section 594B extending in the second direction, and the section 593C extending in the first direction are connected in this order. Since this connection is described with FIG. 21, description about this connection is omitted here.

In FIG. 25B, the absolute values of the angles between the first direction d111 and the scanning direction of sections 603A, 603B, and 603C extending in the first direction in a channel 601B are 10 degrees. The first direction d111 is indicated by a dotted line in FIG. 25B and is along the long side of each section extending in the first direction. In the channel 601B, the sections extending in the first direction and the sections extending in the second direction are connected alternately. Specifically, the section 603A extending in the first direction, the section 604A extending in the second direction, the section 603B extending in the first direction, the section 604B extending in the second direction, and the section 603C extending in the first direction are connected in this order. Since this connection is described with FIG. 21, description about this connection is omitted here.

In FIG. 25C, the absolute values of the angles between the first direction d1111 and the scanning direction of sections 613A, 613B, and 613C extending in the first direction in a channel 611B are 20 degrees. The first direction d1111 is indicated by a dotted line in FIG. 25C and is along the long side of each section extending in the first direction. In the channel 611B, the sections extending in the first direction and the sections extending in the second direction are connected alternately. Specifically, the section 613A extending in the first direction, the section 614A extending in the second direction, the section 613B extending in the first direction, the section 614B extending in the second direction, and the section 613C extending in the first direction are connected in this order. Since this connection is described with FIG. 21, description about this connection is omitted here.

Generalizing the angle between the first direction and the scanning direction, the absolute value of the angle between the first direction and the scanning direction is a predetermined angle. Preferably, the predetermined angle is 0 degrees. As far as the effects described in the embodiments of this disclosure are attained, the predetermined angle can be more than 0 degrees and not more than 20 degrees, for example.

The dimension (size) along the first direction of the channel and the dimension along the scanning direction of a channel satisfy the following formula:

$$D2 = D1 \times \cos\theta,$$

where D2 represents the dimension along the scanning direction of the channel, D1 represents the dimension along the first direction of the channel, and $\theta$ represents the predetermined angle. The dimension along the scanning direction of the channel is an integral multiple of the scanning pitch of a pulse laser beam.

In the cases where the absolute value of the aforementioned angle is more than 0 degrees, the product of the number of sections extending in the first direction that exist along the second direction and the channel width at the position in the first direction of the virtual line of a section extending in the second direction is the total sum of the channel widths of the sections extending in the first direction. The channel width of each section extending in the first direction is equal to the dimension along the second direction of the channel but is not always equal to the width (the width in the direction perpendicular to the first direction) of the so-called channel as the current path of the TFT.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:
1. A display device comprising:
a substrate;
a plurality of light-emitting elements on the substrate; and
a plurality of pixel circuits on the substrate arranged in a longitudinal direction and a transverse direction, being configured to control the plurality of light-emitting elements in one-to-one correspondence,
wherein each of the plurality of pixel circuits includes a thin film transistor,
wherein the thin film transistor includes a channel;
wherein the channel includes cyclic characteristic patterns at even distances in the longitudinal direction, wherein n pixel circuits successively disposed in the longitudinal direction configure a pixel circuit unit, wherein the n is a natural number greater than 1, wherein relative longitudinal positions of channels, including the channel, in the n pixel circuits are different from one another with respect to edges of each of the pixel circuits respectively, wherein distances between the channels adjacent in the longitudinal direction are an integer multiple of a distance between the cyclic characteristic patterns, wherein a length of the pixel circuit unit in the longitudinal direction is equal to N times of the distance between the cyclic characteristic patterns, wherein the N is a natural number greater than the n, wherein at least channels for light-emitting elements of the same color out of the channels have the cyclic characteristic patterns and are disposed at a same phase of the cyclic characteristic patterns, wherein a largest difference values among the distances between channels in the pixel circuit unit is equal to the distance between the cyclic characteristic patterns, and wherein the thin film transistor is a driving thin film transistor configured to control electric current to be supplied to the light-emitting element to control light emission of the light-emitting element.

2. The display device according to claim 1, wherein the channels are made of poly-silicon, and wherein the channels are poly-crystallized by being annealed.

3. The display device according to claim 1, wherein each of the pixel circuits includes a transistor including a channel, wherein the channels of the pixel circuits are disposed at the same phase of the cyclic characteristic patterns, and wherein a pattern of locations of channels in the pixel circuit unit consisting of the successive n pixel circuits is repeated in the successively disposed pixel circuits.

4. The display device according to claim 1, wherein the channel is composed of sections extending in a first direction that is parallel to the longitudinal direction and sections extending in a second direction that is perpendicular to the longitudinal direction and is formed by connecting the sections extending in the first direction and the sections extending in the second direction alternately, wherein at least one end of each section extending in the second direction is connected with a side extending along the first direction of an end part in the first direction of a section extending in the first direction, wherein, in each section extending in the second direction, a middle line extending straight in the second direction from one end to the other end is defined as first virtual line, wherein, at each position in the first direction of the first virtual lines, a sum of a total length of the first virtual lines and a product of a channel width and a number of sections extending in the first direction that are arranged in the second direction, takes a same value, and wherein, at a position in the first direction where a second virtual line extending straight in the second direction does not cross any section extending in the second direction, a product of a number of sections extending in the first direction that is crossed by the second virtual line and the channel width takes a value equal to the same value.

5. A display device comprising:

a substrate;

a plurality of light-emitting elements on the substrate; and a plurality of pixel circuits arranged in a longitudinal direction and transverse direction on the substrate, being configured to control the plurality of light-emitting elements in one-to-one correspondence, wherein each of the plurality of pixel circuits includes a thin film transistor, wherein the thin film transistor includes a channel, wherein the channel includes cyclic characteristic patterns at even distances in the longitudinal direction, wherein the channel is composed of first sections extending in a first direction and second sections extending in a second direction, an absolute value of an angle between the first direction and the longitudinal direction is a predetermined value, the second direction is perpendicular to the longitudinal direction, and the first sections extending in the first direction are connected alternately by ones of the second sections extending in the second direction wherein, in the second direction, a total length of each of the second sections from ones of the first sections to others of the first sections is equal to a total length of each of the first sections, wherein at least one end of each second section extending in the second direction is connected with a side extending along the first direction of an end part in the first direction of a first section, of the first sections, extending in the first direction, wherein, in each second section extending in the second direction, a middle line extending straight in the second direction from one end of ones of the first sections to an other end of the ones of the first sections is defined as first virtual line, wherein, at each position in the first direction of the first virtual lines, a sum of a total length of the first virtual lines and a product of a number of first sections extending in the first direction that exist in the second direction and a channel width takes a same value, wherein, at a position in the first direction where a second virtual line extending straight in the second direction does not cross any second section extending in the second direction, a product of a number of first sections extending in the first direction that is crossed by the second virtual line and the channel width takes a value equal to the same value, and wherein a dimension in the longitudinal direction of the channel is an integral multiple of a distance between the cyclic characteristic patterns.

6. The display device according to claim 5, wherein the channel consists of:

the first section extending in the first direction;

a second section, of the second sections, extending in the second direction connected with the first section;

a third section, of the first sections, extending in the first direction connected with the second section;

a fourth section, of the second sections, extending in the second direction connected with the third section; and a fifth section, of the first sections, extending in the first direction connected with the fourth section.

7. The display device according to claim 5, wherein sums of lengths of overlap segments of third virtual lines extending straight in the second direction at different positions in the first direction with the channel are the same value.

8. The display device according to claim 5, wherein a part of the first section extending in the first direction where the first section extending in the first direction is connected with a second section, of the second sections, extending in the second direction includes a curve.

9. The display device according to claim 8,
wherein third virtual lines extending straight in the second direction are located at different positions in the first direction but outside the curve, and
wherein sums of lengths of overlap segments of the third virtual lines with the channel are the same value.

10. The display device according to claim 5,
wherein the plurality of pixel circuits are disposed at different positions, and
wherein at least channels for light-emitting elements of the same color out of the channels are disposed at the same phase of the cyclic characteristic patterns.

11. The display device according to claim 5, wherein a dimension along the first direction of the channel and a dimension of the channel along the longitudinal direction satisfy the following formula:

$$D2=D1 \times \cos \theta,$$

where D2 represents the dimension of the channel along the longitudinal direction, D1 represents the dimension along the first direction of the channel, and θ represents the predetermined angle.

12. The display device according to claim 6, wherein, in the second direction:
a sum of total lengths of the first section, the second section, and the third section is equal to a sum of total lengths of the third section, the fourth section, and the fifth section, and
a total length, of the total lengths and of the second section, is equal to a total length of each of the first section, the third section, the fourth section, and the fifth section respectively.

13. A display device comprising:
a substrate;
a plurality of light-emitting elements on the substrate; and
a plurality of pixel circuits arranged in a longitudinal direction and transverse direction on the substrate, being configured to control the plurality of light-emitting elements in one-to-one correspondence,
wherein each of the plurality of pixel circuits includes a thin film transistor,
wherein the thin film transistor includes a channel,
wherein the channel includes cyclic characteristic patterns at even distances in the longitudinal direction,
wherein the channel is composed of first sections extending in a first direction and second sections extending in a second direction, an absolute value of an angle between the first direction and the longitudinal direction is a predetermined value, the second direction is perpendicular to the longitudinal direction, and the first sections extending in the first direction are connected alternately by ones of the second sections extending in the second direction, and
wherein, in the second direction, a total length of each of the second sections from ones of the first sections to others of the first sections is equal to a total length of each of the first sections.

* * * * *

UNITED STATES PATENT AND TRADEMARK OFFICE
CERTIFICATE OF CORRECTION

PATENT NO. : 11,232,949 B2
APPLICATION NO. : 16/454933
DATED : January 25, 2022
INVENTOR(S) : Seko It is certified that error appears in the above-identified patent and that said Letters Patent is hereby corrected as shown below:

On the Title Page

Column 1, item (73) Assignee:
Insert second Assignee, --Tianma Japan, Ltd., Kanagawa (JP);--

Signed and Sealed this
Fifth Day of September, 2023

Katherine Kelly Vidal
*Director of the United States Patent and Trademark Office*